(12) United States Patent
Endo et al.

(10) Patent No.: US 7,550,253 B2
(45) Date of Patent: Jun. 23, 2009

(54) BARRIER FILM MATERIAL AND PATTERN FORMATION METHOD USING THE SAME

(75) Inventors: Masayuki Endo, Osaka (JP); Masaru Sasago, Osaka (JP)

(73) Assignee: Panasonic Corporation, Osaka (JP)

( * ) Notice: Subject to any disclaimer, the term of this patent is extended or adjusted under 35 U.S.C. 154(b) by 639 days.

(21) Appl. No.: 11/058,369

(22) Filed: Feb. 16, 2005

(65) Prior Publication Data

US 2005/0186516 A1    Aug. 25, 2005

(30) Foreign Application Priority Data

Feb. 25, 2004    (JP)  .............. 2004-049323
Dec. 14, 2004    (JP)  .............. 2004-361058

(51) Int. Cl.
     *G03F 7/00*      (2006.01)

(52) U.S. Cl. .............. 430/322; 430/273.1; 430/302; 430/330; 430/918; 430/922

(58) Field of Classification Search .......... 430/322, 430/302, 270.1, 273.1, 330, 918, 922, 945
See application file for complete search history.

(56) References Cited

U.S. PATENT DOCUMENTS

| 4,599,243 | A * | 7/1986 | Sachdev et al. ............... 216/18 |
| 6,602,382 | B1 * | 8/2003 | Matsuyama et al. .... 156/345.11 |
| 2004/0224525 | A1 | 11/2004 | Endo et al. |
| 2004/0253547 | A1 | 12/2004 | Endo et al. |
| 2004/0259008 | A1 | 12/2004 | Endo et al. |
| 2005/0036183 | A1 * | 2/2005 | Yeo et al. ....................... 359/15 |
| 2005/0036184 | A1 * | 2/2005 | Yeo et al. ....................... 359/15 |
| 2005/0164502 | A1 * | 7/2005 | Deng et al. ................. 438/689 |
| 2005/0266354 | A1 * | 12/2005 | Li et al. ....................... 430/322 |

FOREIGN PATENT DOCUMENTS

| JP | 2-3051 | 1/1990 |
| JP | 9-90615 | 4/1997 |
| JP | 2000-517373 | 12/2000 |
| WO | WO 98/10010 | 3/1998 |
| WO | WO 2004/074937 A1 | 9/2004 |

OTHER PUBLICATIONS

M. Switkes, et al. "Immersion lithography at 157 nm", J. Vac. Sci. Technol., B19, pp. 2353-2356 (2001).

* cited by examiner

*Primary Examiner*—Thorl Chea
(74) *Attorney, Agent, or Firm*—McDermott Will & Emery LLP

(57) ABSTRACT

A resist film made of a chemically amplified resist is formed on a substrate. Subsequently, a barrier film for preventing a component of the resist film from eluting into an immersion liquid or preventing the immersion liquid from permeating into the resist film is formed on the resist film. Thereafter, with an immersion liquid provided on the barrier film, pattern exposure is carried out by selectively irradiating the resist film with exposing light through the barrier film. Then, after removing the barrier film, the resist film having been subjected to the pattern exposure is developed, so as to form a resist pattern made of the resist film.

44 Claims, 20 Drawing Sheets

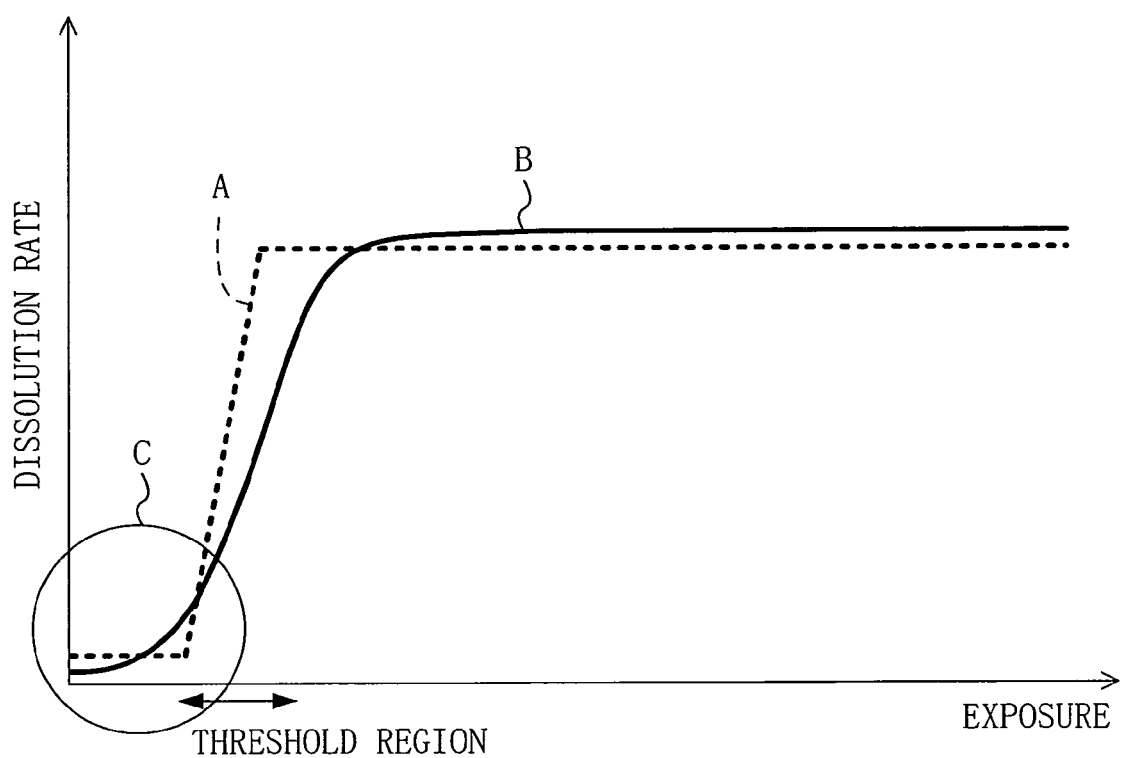

BARRIER FILM MATERIAL AND PATTERN FORMATION METHOD USING THE SAME

CROSS-REFERENCE TO RELATED APLICATIONS

This application claims priority under 35 U.S.C. §119 on Patent Application No. 2004-49323 filed in Japan on Feb. 25, 2004, and Patent Application No. 2004-361058 filed in Japan on Dec. 14, 2004, the entire contents of which are hereby incorporated by reference.

BACKGROUND OF THE INVENTION

The present invention relates to a material for a barrier film formed on a resist film for use in fabrication process or the like for semiconductor devices and a pattern formation method using the same.

In accordance with the increased degree of integration of semiconductor integrated circuits and downsizing of semiconductor devices, there are increasing demands for further rapid development of lithography technique. Currently, pattern formation is carried out through photolithography using exposing light of a mercury lamp, KrF excimer laser, ArF excimer laser or the like, and use of $F_2$ laser lasing at a shorter wavelength is being examined. However, since there remain a large number of problems in exposure systems and resist materials, photolithography using exposing light of a shorter wavelength has not been put to practical use.

In these circumstances, immersion lithography has been recently proposed for realizing further refinement of patterns by using conventional exposing light (for example, see M. Switkes and M. Rothschild, "Immersion lithography at 157 nm", J. Vac. Sci. Technol., Vol. B19, p. 2353 (2001)).

In the immersion lithography, a region in an exposure system sandwiched between a projection lens and a resist film formed on a wafer is filled with a liquid having a refractive index n and therefore, the NA (numerical aperture) of the exposure system has a value n·NA. As a result, the resolution of the resist film can be improved.

Now, a conventional pattern formation method employing the immersion lithography will be described with reference to FIGS. 20A through 20D.

First, a positive chemically amplified resist material having the following composition is prepared:

Base polymer: poly((norbornene-5-methylene-t-butylcarboxylate) (50 mol %)-(maleic anhydride) (50 mol %)) . . . 2 g Acid generator: triphenylsulfonium triflate . . . 0.06 g Quencher: triethanolamine . . . 0.002 g Solvent: propylene glycol monomethyl ether acetate . . . 20 g Next, as shown in FIG. 20A, the aforementioned chemically amplified resist material is applied on a substrate 1 so as to form a resist film 2 with a thickness of 0.35 μm.

Then, as shown in FIG. 20B, with an immersion liquid (water) 3 provided on the resist film 2, pattern exposure is carried out by irradiating the resist film 2 with exposing light 4 of ArF excimer laser with NA of 0.68 through a mask 5.

After the pattern exposure, as shown in FIG. 20C, the resist film 2 is baked with a hot plate at a temperature of 105° C. for 60 seconds, and the resultant resist film is developed with a 2.38 wt % tetramethylammonium hydroxide aqueous solution (alkaline developer). In this manner, a resist pattern 2a made of an unexposed portion of the resist film 2 and having a line width of 0.09 μm is formed as shown in FIG. 20D.

SUMMARY OF THE INVENTION

As shown in FIG. 20D, however, the resist pattern 2a formed by the conventional pattern formation method is in a defective shape.

The present inventors have variously examined the reason why the resist pattern formed by the conventional immersion lithography is in a defective shape, resulting in finding the following: The resist film cannot exhibit its expected performance because a low-molecular-weight compound such as the acid generator or the quencher is eluted from the resist film 2 into the liquid 3 provided on the resist film 2 or because the liquid 3 permeates into the resist film 2. For example, in the case shown in FIG. 20D, the resist pattern 2a is in a defective shape with a T-top shaped portion probably because the concentration of an acid generated from the acid generator is lowered on the interface between an exposed portion and the unexposed portion of the resist film 2. On the contrary, when the concentration of the quencher used for deactivating the acid is lowered, the resultant resist pattern 2a is in a defective shape with round shoulders.

In either case, when the resist pattern 2a in such a defective shape is used for etching a target film, the resultant pattern of the target film is also in a defective shape, which disadvantageously lowers the productivity and the yield in the fabrication process for semiconductor devices.

In consideration of the aforementioned conventional problem, an object of the invention is forming a fine resist pattern in a good shape by preventing the influence of an immersion liquid used in the immersion lithography on a resist film.

The present inventors have found, on the basis of the aforementioned result of the examination, that a component of a resist film can be prevented from eluting into a liquid or a liquid can be prevented from permeating into a resist film by forming a barrier film on the resist film so as not to allow the resist film to be in direct contact with the liquid provided thereon. Furthermore, the barrier film formed on the resist film has such a composition that its solubility is changed in accordance with the value of hydrogen ion exponent (pH), so that the barrier film can be insoluble in the liquid but soluble in a developer.

The present invention was devised on the basis of the aforementioned findings, and according to the invention, a barrier film for preventing a component of a resist film from eluting into a liquid or for preventing a liquid from permeating into a resist film is formed on the resist film, so that the resist film can keep its expected performance. Specifically, the present invention is practiced as follows:

The barrier film material of this invention is a material for a barrier film formed between a resist film made of a chemically amplified resist and a liquid in performing exposure with the liquid provided above the resist film, and the barrier film prevents a component of the resist film from eluting into the liquid or prevents the liquid from permeating into the resist film.

According to this invention, in immersion lithography in which a resist film made of a chemically amplified resist is exposed with a liquid provided on the resist film, the barrier film made of the barrier film material and formed between the resist film and the liquid prevents a component, such as an acid generator or a quencher, of the resist film from eluting into the liquid or prevents the liquid from permeating into the resist film. Therefore, the resist film keeps the expected performance of the chemically amplified resist through the exposure. As a result, a resist pattern can be formed in a good shape.

In the barrier film material of the invention, the barrier film preferably has solubility different depending upon a value of hydrogen ion exponent (pH). Furthermore, the barrier film is preferably soluble in a solution with a value of hydrogen ion exponent (pH) larger than 7. In other words, when the barrier film has a composition, for example, that is insoluble in the liquid but soluble in an alkaline developer, the barrier film does not dissolve in the liquid during the exposure but can be easily removed after the exposure.

The barrier film material of the invention can include an alkali-soluble polymer and a fluorine-based surface active agent. Since a fluorine-based surface active agent has a higher hydrophobic property than a surface active agent not including fluorine, when the barrier film is made of an alkali-soluble polymer including a fluorine-based surface active agent, even if a liquid is provided on the barrier film, the barrier film does not dissolve in the liquid. Accordingly, the barrier film of the invention can prevent contact between the resist film and the liquid, and hence, it can prevent a component of the resist film from eluting into the liquid or prevent the liquid from permeating into the resist film. A sufficient effect can be attained when the content of the fluorine-based surface active agent in the alkali-soluble polymer is approximately $1/100$ wt % through $1/10$ wt %, which does not limit the invention, and the content may be smaller or larger.

In a known technique, an antireflection film for preventing reflection of exposing light is formed on a resist film. A surface active agent is sometimes included in the antireflection film, but the concentration of the surface active agent in the antireflection film is smaller than the content of the fluorine-based surface active agent in the alkali-soluble polymer of this invention by one or more figures. This is because the surface active agent is included in the antireflection film for the purpose of improving the application property of the antireflection film. In addition, the antireflection film is water-soluble, and hence, when a large amount of surface active agent is included in the antireflection film, the hydrophobic property of the antireflection film is so high that it may not be dissolved in water. In contrast, the barrier film of this invention is insoluble in a neutral or acidic solution.

The alkali-soluble polymer included in the barrier film material of this invention can be at least one of polyvinyl hexafluoroisopropyl alcohol, polyvinyl alcohol, polyacrylic acid, polystyrenesulfonic acid, hydroxyethyl cellulose, polyisoplenesulfonic acid, polyvinyl pyrrolidone and pullulan.

Furthermore, the fluorine-based surface active agent may have a group with a double bond. Also, the group with a double bond may be a perfluoroalkenyl group.

The perfluoroalkenyl group may be a 1,1-di(perfluoromethyl)-2-perfluoroethylethenyl group or a 1,1-di(perfluoroisopropyl)-2-perfluoromethylethenyl group.

Moreover, the fluorine-based surface active agent having the 1,1-di(perfluoromethyl)-2-perfluoroethylethenyl group may be 1,1-di(perfluoromethyl)-2-perfluoroethylethenyloxybenzyltrimethylammonium or 1,1-di(perfluoromethyl)-2-perfluoroethylethenylpolyoxyethylene ether.

Alternatively, the fluorine-based surface active agent having the 1,1-di(perfluoroisopropyl)-2-perfluoromethylethenyl group may be 1,1-di(perfluoroisopropyl)-2-perfluoromethylethenyloxybenzyltrimethylammonium or 1,1-di(perfluoroisopropyl)-2-perfluoromethylethenylpolyoxyethylene ether.

Furthermore, the present inventors have found that when a polymer having a sulfonamide structure is used as the barrier film material, a resultant barrier film including the polymer having the sulfonamide structure can prevent the contact between the liquid and the resist film.

The polymer having a sulfonamide structure is soluble in a solution with a value of hydrogen ion exponent (pH) larger than 7 while it is insoluble in a neutral or acidic solution. Accordingly, it is not dissolved in a neutral or acidic solution generally having a value of pH of 7 or less and is soluble in an alkaline aqueous solution used as a developer, and hence, it can be easily removed after the exposure.

The barrier film of this invention preferably includes a polymer having a sulfonamide structure.

In this case, the polymer may be polyvinyl sulfonamide or a polyvinyl sulfonamide derivative. The polyvinyl sulfonamide derivative may be polyvinylsulfone alkylamide, polyvinylsulfone alkylamide fluoride or polyvinysulfone substituted alkylamide.

Also, a substituent group of the polyvinysulfone substituted alkylamide may be a hydroxyl group, an alkoxy group, an oxo group, an amino group or an alkylamino group.

The first pattern formation method using the barrier film material of this invention includes the steps of forming a resist film made of a chemically amplified resist on a substrate; forming a barrier film on the resist film; performing pattern exposure by selectively irradiating the resist film with exposing light with a liquid provided on the barrier film; removing the barrier film; and forming a resist pattern made of the resist film by developing the resist film after removing the barrier film, and the barrier film prevents a component of the resist film from eluting into the liquid or prevents the liquid from permeating into the resist film.

In the first pattern formation method, the barrier film formed on the resist film prevents a component of the resist film from eluting into the liquid or prevents the liquid from permeating into the resist film, and therefore, the resist film keeps the expected performance of the chemically amplified resist during the pattern exposure. As a result, the resist pattern made of the resist film can be formed in a good shape. In this case, the barrier film can be removed before the development with an aqueous solution having a pH value for dissolving the barrier film, and examples of such a solution are a developer and a diluted developer. The diluted developer is diluted to an extent of a concentration lower than a general alkaline developer (i.e., 2.38 wt % tetramethylammonium hydroxide), and the concentration is, for example, approximately 0.001 wt % through 2 wt %, whereas the concentration does not limit the invention.

The second pattern formation method using the barrier film material of this invention includes the steps of forming a resist film made of a chemically amplified resist on a substrate; forming a barrier film on the resist film; performing pattern exposure by selectively irradiating the resist film with exposing light with a liquid provided on the barrier film; and removing the barrier film and forming a resist pattern made of the resist film by developing the resist film after the pattern exposure, and the barrier film prevents a component of the resist film from eluting into the liquid or prevents the liquid from permeating into the resist film.

In the second pattern formation method, the barrier film formed on the resist film prevents a component of the resist film from eluting into the liquid or prevents the liquid from permeating into the resist film in the same manner as in the first pattern formation method, and therefore, the resist film keeps the expected performance of the chemically amplified resist during the pattern exposure. As a result, the resist pattern made of the resist film can be formed in a good shape.

A difference between the first pattern formation method and the second pattern formation method is that the barrier film formed on the resist film is removed before the development in the first pattern formation method while it is removed during the development with a developer in the second pattern formation method. In the case of the first pattern formation method, since the barrier film is removed before the development, the development processing is generally proceeded. Alternatively, in the case of the second pattern formation method, since the barrier film is removed during the development, the dissolution characteristic of the resist can be controlled, resulting in improving the dissolution characteristic of the resist. The control of the dissolution characteristic will be described later.

The first or second pattern formation method preferably further includes, before the step of performing pattern exposure, a step of annealing the barrier film. When the barrier film is thus annealed, the denseness of the barrier film is improved and hence its insoluble property in the liquid is improved. It is noted that the barrier film should be annealed at a temperature of an appropriate range because the barrier film is difficult to remove by dissolving it if its denseness is excessively improved. The appropriate range of the annealing temperature depends upon the composition of the barrier film and is, for example, approximately 100° C. through 150° C., which does not limit the invention.

In the first or second pattern formation method, the barrier film preferably has solubility different depending upon a value of hydrogen ion exponent (pH). When the barrier film has such a composition that it is insoluble in the liquid but is soluble in an alkaline developer, the barrier film can be easily and definitely removed after the pattern exposure.

In the first or second pattern formation method, the barrier film preferably includes an alkali-soluble polymer and a fluorine-based surface active agent. Specifically, the compounds described with respect to the barrier film material of this invention may be used as the alkali-soluble polymer and the fluorine-based surface active agent.

In the first or second pattern formation method, the barrier film preferably includes a polymer having a sulfonamide structure. Specifically, the compounds described with respect to the barrier film material of this invention may be used as the polymer having a sulfonamide structure.

In the first or second pattern formation method, the liquid may be water or perfluoropolyether. Also, the liquid may include an additive such as a surface active agent.

Alternatively, in the first or second pattern formation method, the liquid may be an acidic solution. Examples of the acidic solution are a phosphoric acid aqueous solution and a cesium sulfate aqueous solution, which does not limit the invention.

In the first or second pattern formation method, the exposing light may be KrF excimer laser, ArF excimer laser, $F_2$ laser, ArKr laser or $Ar_2$ laser.

BRIEF DESCRIPTION OF THE DRAWINGS

FIG. 7 is a graph for explaining control of solubility of a resist in the pattern formation method using the barrier film material of Embodiment 3;

DETAILED DESCRIPTION OF THE INVENTION

Embodiment 1

A pattern formation method using a barrier film material according to Embodiment 1 of the invention will now be described with reference to FIGS. 1A through 1D, 2A and 2B.

Figure 1A:
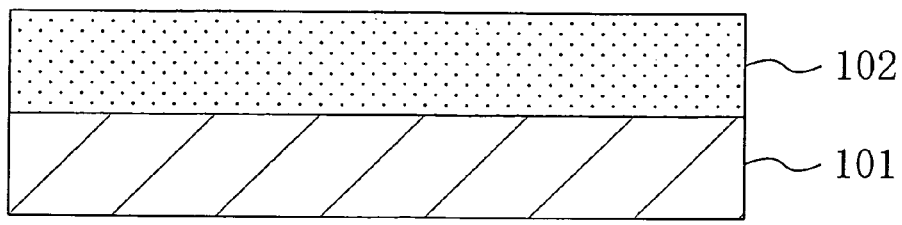
FIGS. 1A, 1B, 1C and 1D are cross-sectional views for showing procedures in a pattern formation method using a barrier film material according to Embodiment 1 of the invention.

First, a positive chemically amplified resist material having the following composition is prepared:

Base polymer: poly((norbornene-5-methylene-t-butylcarboxylate) (50 mol %)-(maleic anhydride) (50 mol %)) . . . 2 g Acid generator: triphenylsulfonium triflate . . . 0.06 g
Quencher: triethanolamine . . . 0.002 g
Solvent: propylene glycol monomethyl ether acetate . . . 20 g Next, as shown in FIG. 1A, the aforementioned chemically amplified resist material is applied on a substrate 101 so as to form a resist film 102 with a thickness of 0.35 μm.

Figure 1B:
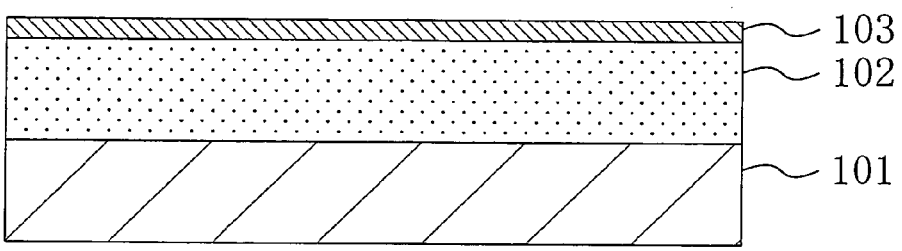
Figure 1C:
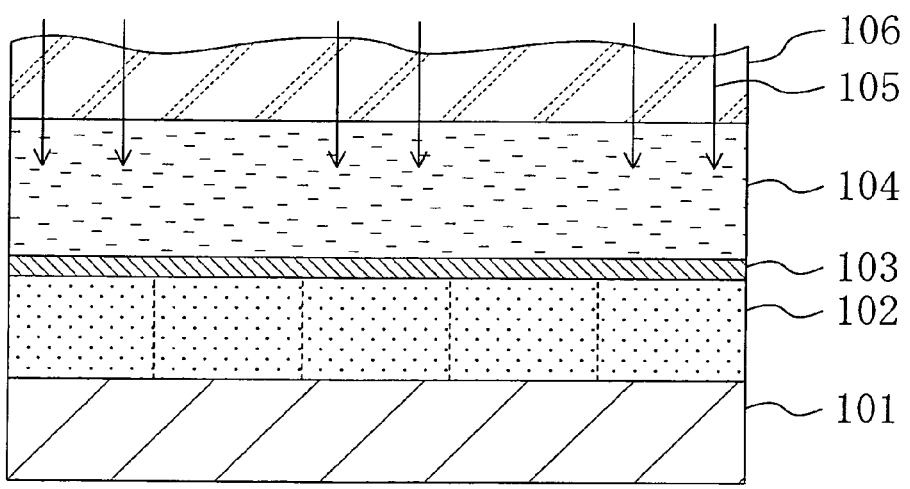

Then, as shown in FIG. 1B, a barrier film 103 that is made of a barrier film material having the following composition, has a thickness of 0.06 μm and is different in its solubility depending upon the value of pH is formed on the resist film 102 by, for example, spin coating:

Alkali-soluble polymer: polyvinyl alcohol . . . 1 g
Fluorine-based surface active agent: 1,1-di(perfluoromethyl)-2-perfluoroethylethenyloxybenzyltrimethylammonium . . . 0.0003 g
Solvent: isobutyl alcohol . . . 20 g Next, as shown in FIG. 1C, with an immersion liquid 104 of water provided between the barrier film 103 and a projection lens 106 by, for example, a puddle method, pattern exposure is carried out by irradiating the resist film 102 through the barrier film 103 with exposing light 105 of ArF excimer laser with NA of 0.68 having passed through a mask (not shown).

Figure 1D:
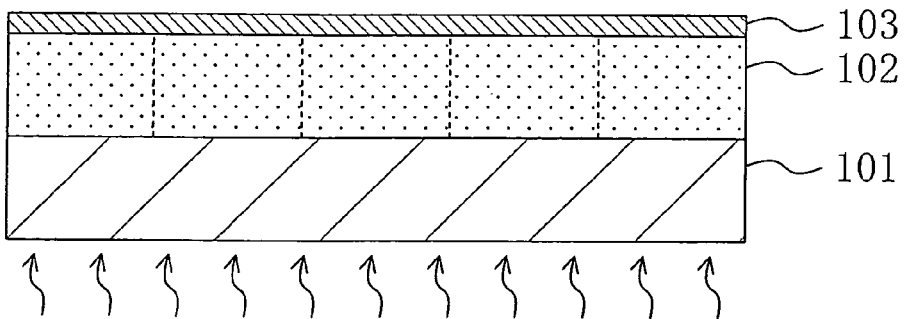

After the pattern exposure, as shown in FIG. 1D, the resist film 102 is baked with a hot plate at a temperature of 105° C. for 60 seconds (post exposure bake).

Figure 2A:
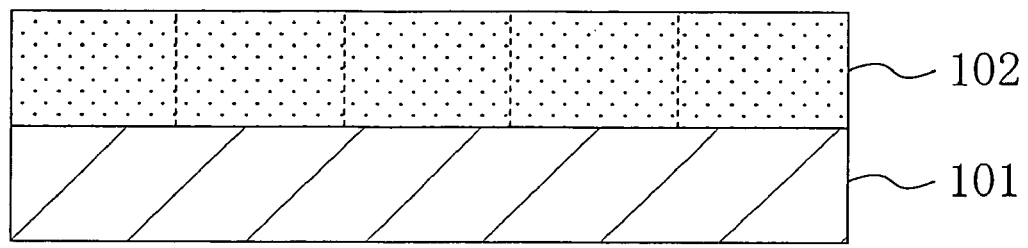
FIGS. 2A and 2B are cross-sectional views for showing other procedures in the pattern formation method using the barrier film material of Embodiment 1.
Figure 2B:
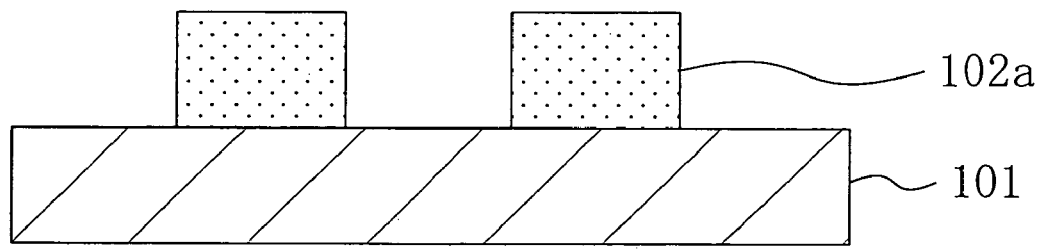

Next, as shown in FIG. 2A, the barrier film 103 is removed with, for example, a 0.01 wt % tetramethylammonium hydroxide aqueous solution (diluted alkaline developer). Thereafter, the resultant resist film 102 is developed with a 2.38 wt % tetramethylammonium hydroxide aqueous solution (alkaline developer). In this manner, a resist pattern 102a made of an unexposed portion of the resist film 102 and having a line width of 0.09 μm is formed in a good shape as shown in FIG. 2B.

In this manner, according to Embodiment 1, before carrying out the pattern exposure shown in FIG. 1C, the barrier film 103 including the alkali-soluble polymer and the fluorine-based surface active agent is formed on the resist film 102. Therefore, the resist film 102 is never in direct contact with the immersion liquid 104. Accordingly, a component of the resist film 102 such as the acid generator or the quencher can be prevented from eluting into the immersion liquid 104 or the immersion liquid 104 can be prevented from permeating into the resist film 102 on the contrary, and hence, the resist film 102 keeps the expected performance of the chemically amplified resist through the exposure and the post exposure bake performed thereafter. As a result, the resist pattern 102a made of the resist film 102 is not degraded in its shape.

Embodiment 2

A pattern formation method using a barrier film material according to Embodiment 2 of the invention will now be described with reference to FIGS. 3A through 3D and 4A through 4C.

Figure 3A:
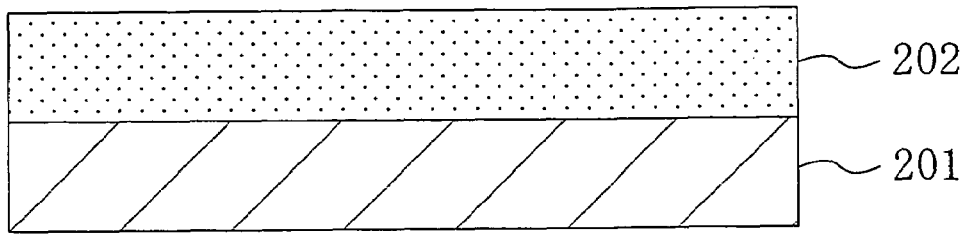
FIGS. 3A, 3B, 3C and 3D are cross-sectional views for showing procedures in a pattern formation method using a barrier film material according to Embodiment 2 of the invention.

First, a positive chemically amplified resist material having the following composition is prepared:

Base polymer: poly((norbornene-5-methylene-t-butylcarboxylate) (50 mol %)-(maleic anhydride) (50 mol %)) . . . 2 g
Acid generator: triphenylsulfonium triflate . . . 0.06 g
Quencher: triethanolamine . . . 0.002 g
Solvent: propylene glycol monomethyl ether acetate . . . 20 g Next, as shown in FIG. 3A, the aforementioned chemically amplified resist material is applied on a substrate 201 so as to form a resist film 202 with a thickness of 0.35 μm.

Figure 3B:
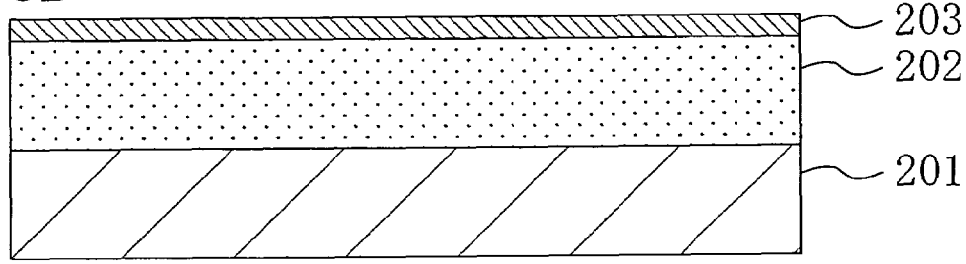
Figure 3C:
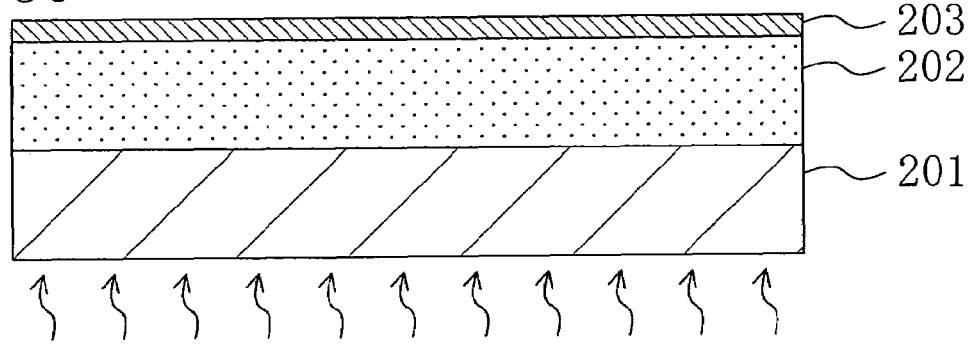

Then, as shown in FIG. 3B, a barrier film 203 that is made of a barrier film material having the following composition, has a thickness of 0.07 μm and is different in its solubility depending upon the value of pH is formed on the resist film 202 by, for example, the spin coating:

Alkali-soluble polymer: polyvinyl pyrrolidone . . . 1 g
Fluorine-based surface active agent: 1,1-di(perfluoroisopropyl)-2-perfluoromethylethenyloxybenzyltrimethylammonium . . . 0.0005 g
Solvent: n-butyl alcohol . . . 20 g Next, as shown in FIG. 3C, the barrier film 203 is annealed with a hot plate at a temperature of 120° C. for 90 seconds, so as to improve the denseness of the barrier film 203.

Figure 3D:
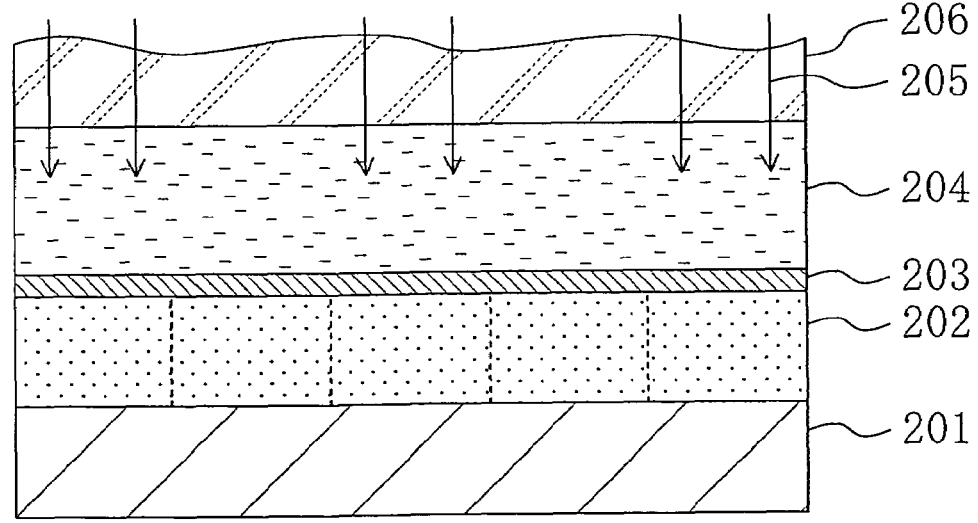

After the annealing, as shown in FIG. 3D, with an immersion liquid 204 of water provided between the barrier film 203 and a projection lens 206 by, for example, the puddle method, pattern exposure is carried out by irradiating the resist film 202 through the barrier film 203 with exposing light 205 of ArF excimer laser with NA of 0.68 having passed through a mask (not shown).

Figure 4A:
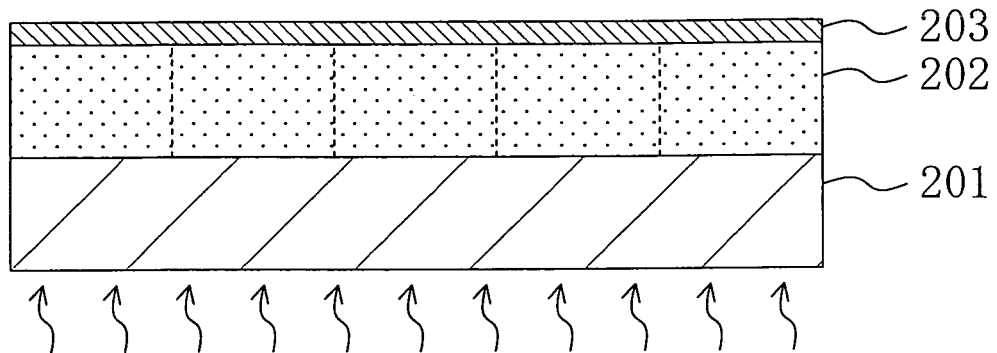
FIGS. 4A, 4B and 4C are cross-sectional views for showing other procedures in the pattern formation method using the barrier film material of Embodiment 2.

After the pattern exposure, as shown in FIG. 4A, the resist film 202 is baked with a hot plate at a temperature of 105° C. for 60 seconds (post exposure bake).

Figure 4B:
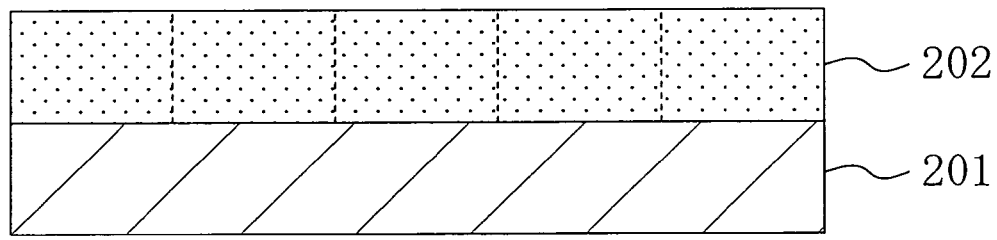
Figure 4C:
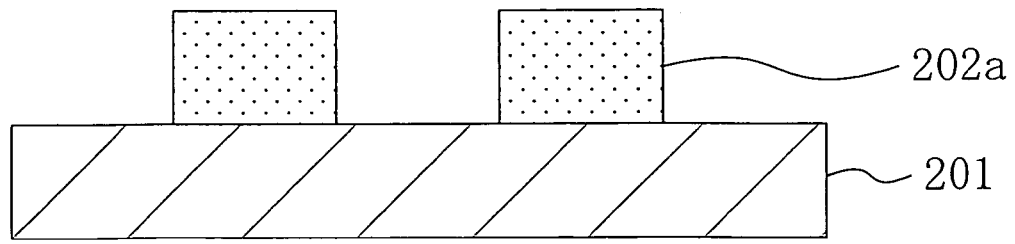

Next, as shown in FIG. 4B, the barrier film 203 is removed with, for example, a 0.005 wt % tetramethylammonium hydroxide aqueous solution (diluted alkaline developer). Thereafter, the resultant resist film 202 is developed with a 2.38 wt % tetramethylammonium hydroxide aqueous solution (alkaline developer). In this manner, a resist pattern 202a made of an unexposed portion of the resist film 202 and having a line width of 0.09 μm is formed in a good shape as shown in FIG. 4C.

In this manner, according to Embodiment 2, before carrying out the pattern exposure shown in FIG. 3D, the barrier film 203 including the alkali-soluble polymer and the fluorine-based surface active agent is formed on the resist film 202. Therefore, the resist film 202 is never in direct contact with the immersion liquid 204. Accordingly, a component of the resist film 202 such as the acid generator or the quencher can be prevented from eluting into the immersion liquid 204 or the immersion liquid 204 can be prevented from permeating into the resist film 202 on the contrary, and hence, the resist film 202 keeps the expected performance of the chemically amplified resist through the exposure and the post exposure bake performed thereafter. As a result, the resist pattern 202a made of the resist film 202 is not degraded in its shape.

In addition, in Embodiment 2, since the barrier film 203 is annealed for improving the denseness as shown in FIG. 3C before the pattern exposure, the insolubility of the barrier film 203 in the immersion liquid 204 (water) is increased. Therefore, the function of the barrier film 203 as a barrier for preventing the acid generator or the like from eluting from the resist film 202 into the immersion liquid 204 can be improved.

Embodiment 3

A pattern formation method using a barrier film material according to Embodiment 3 of the invention will now be described with reference to FIGS. 5A through 5D and 6.

Figure 5A:
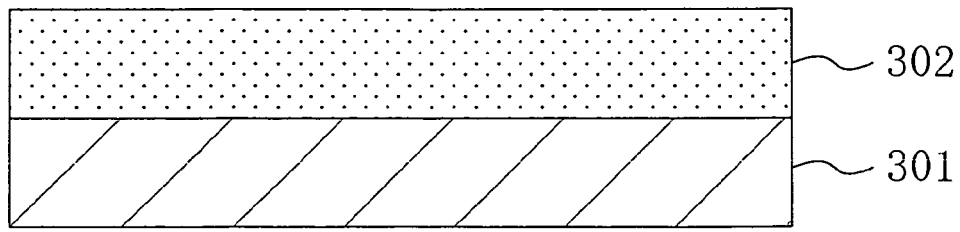
FIGS. 5A, 5B, 5C and 5D are cross-sectional views for showing procedures in a pattern formation method using a barrier film material according to Embodiment 3 of the invention.

First, a positive chemically amplified resist material having the following composition is prepared:

Base polymer: poly((norbornene-5-methylene-t-butylcarboxylate) (50 mol %)-(maleic anhydride) (50 mol %)) . . . 2 g
Acid generator: triphenylsulfonium triflate . . . 0.06 g
Quencher: triethanolamine . . . 0.002 g
Solvent: propylene glycol monomethyl ether acetate . . . 20 g Next, as shown in FIG. 5A, the aforementioned chemically amplified resist material is applied on a substrate 301 so as to form a resist film 302 with a thickness of 0.35 μm.

Figure 5B:
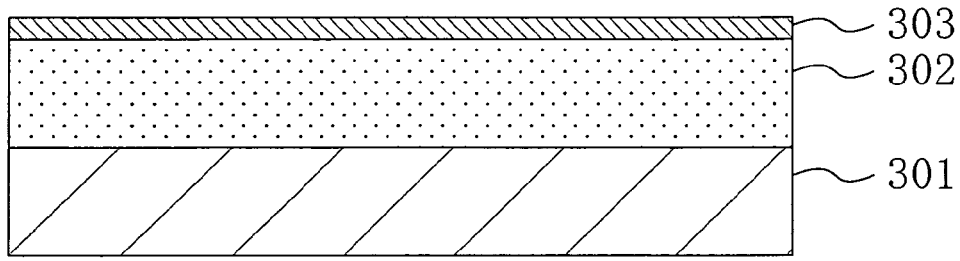

Then, as shown in FIG. 5B, a barrier film 303 that is made of a barrier film material having the following composition, has a thickness of 0.05 μm and is different in its solubility depending upon the value of pH is formed on the resist film 302 by, for example, the spin coating:

Alkali-soluble polymer: polyacrylic acid . . . 1 g

Figure 5C:
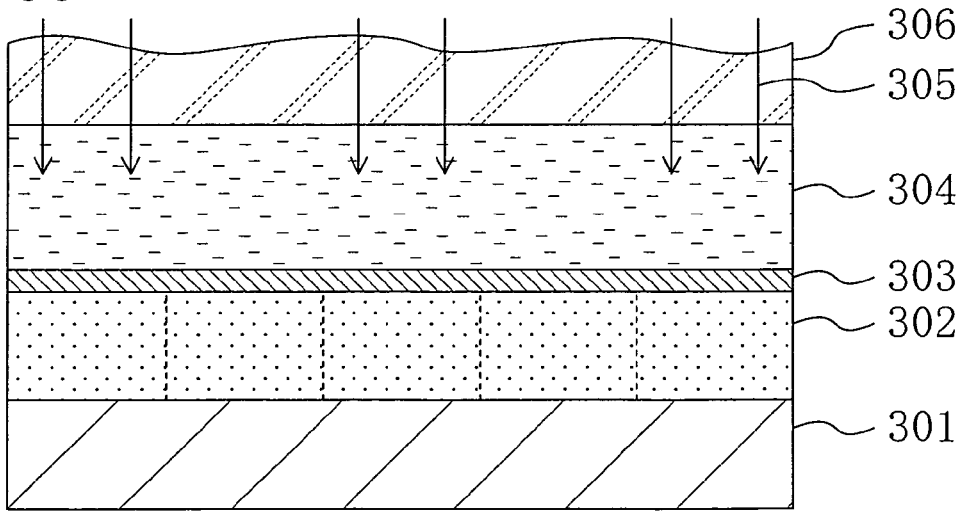

Fluorine-based surface active agent: 1,1-di(perfluoromethyl)-2-perfluoroethylethenylpolyoxyethylene ether . . . 0.0006 g Solvent: n-butyl alcohol . . . 20 g Next, as shown in FIG. 5C, with an immersion liquid 304 of water provided between the barrier film 303 and a projection lens 306 by, for example, the puddle method, pattern exposure is carried out by irradiating the resist film 302 through the barrier film 303 with exposing light 305 of ArF excimer laser with NA of 0.68 having passed through a mask (not shown).

Figure 5D:
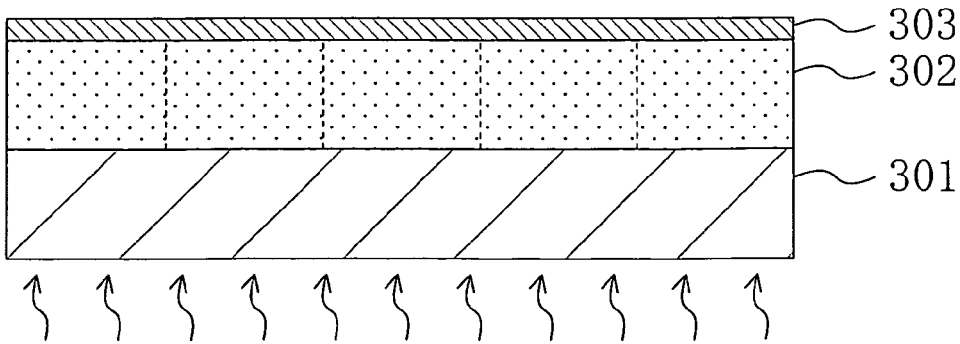

After the pattern exposure, as shown in FIG. 5D, the resist film 302 is baked with a hot plate at a temperature of 105° C. for 60 seconds (post exposure bake).

Figure 6:
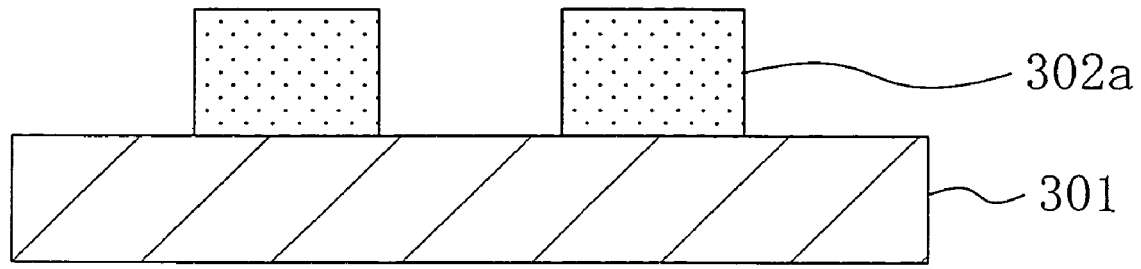
FIG. 6 is a cross-sectional view for showing another procedure in the pattern formation method using the barrier film material of Embodiment 3.

Next, the barrier film 303 is removed and the resultant resist film 302 is developed with a 2.38 wt % tetramethylammonium hydroxide aqueous solution (alkaline developer). In this manner, a resist pattern 302a made of an unexposed portion of the resist film 302 and having a line width of 0.09 μm is formed in a good shape as shown in FIG. 6.

In this manner, according to Embodiment 3, before carrying out the pattern exposure shown in FIG. 5C, the barrier film 303 including the alkali-soluble polymer and the fluorine-based surface active agent is formed on the resist film 302. Therefore, the resist film 302 is never in direct contact with the immersion liquid 304. Accordingly, a component of the resist film 302 such as the acid generator or the quencher can be prevented from eluting into the immersion liquid 304 or the immersion liquid 304 can be prevented from permeating into the resist film 302 on the contrary, and hence, the resist film 302 keeps the expected performance of the chemically amplified resist through the exposure and the post exposure bake performed thereafter. As a result, the resist pattern 302a made of the resist film 302 is not degraded in its shape.

In the pattern formation method of Embodiment 3, the barrier film 303 is removed during the development, namely, with the alkaline developer, differently from those of Embodiments 1 and 2. Thus, the dissolution characteristic of the resist film 302 can be controlled. The control of the dissolution characteristic will now be described with reference to FIG. 7.

In general, when the dissolution characteristic of a resist in a developer is high, the dissolution rate is abruptly increased when exposure exceeds a given threshold value as shown with a graph A of a broken line in FIG. 7. As the change of the dissolution rate against the exposure is more abrupt, a difference in the solubility between an exposed portion and an unexposed portion of the resist film 302 is larger, and hence, higher resolution can be attained, namely, the resist pattern 302a can be formed in a better shape. Accordingly, in the case where the barrier film 303 is removed simultaneously with the development, the dissolution rate is wholly lowered during the removal of the barrier film 303 as shown with a graph B of a solid line in FIG. 7, and hence, the change in a portion surrounded with a circle C in the graph B can be reduced to be approximated to a flat portion of the graph A. As a result, in the case where the actual resist has the dissolution characteristic as shown with the graph B, the dissolution rate attained with smaller exposure can be adjusted to attain a comparatively constant state with small exposure and a low dissolution rate within a given range. Accordingly, the difference in the solubility between an exposed portion and an unexposed portion of the resist film 302 can be substantially increased, resulting in easily forming a resist pattern in a good shape.

Embodiment 4

A pattern formation method using a barrier film material according to Embodiment 4 of the invention will now be described with reference to FIGS. 8A through 8D, 9A and 9B.

Figure 8A:
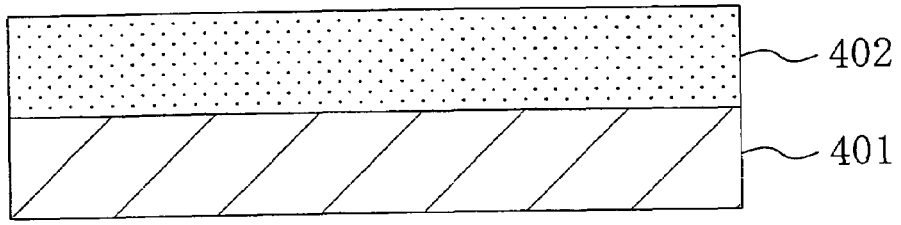
FIGS. 8A, 8B, 8C and 8D are cross-sectional views for showing procedures in a pattern formation method using a barrier film material according to Embodiment 4 of the invention.

First, a positive chemically amplified resist material having the following composition is prepared:

Base polymer: poly((norbornene-5-methylene-t-butylcarboxylate) (50 mol %)-(maleic anhydride) (50 mol %)) . . . 2 g Acid generator: triphenylsulfonium triflate . . . 0.06 g Quencher: triethanolamine . . . 0.002 g Solvent: propylene glycol monomethyl ether acetate . . . 20 g Next, as shown in FIG. 8A, the aforementioned chemically amplified resist material is applied on a substrate 401 so as to form a resist film 402 with a thickness of 0.35 μm.

Figure 8B:
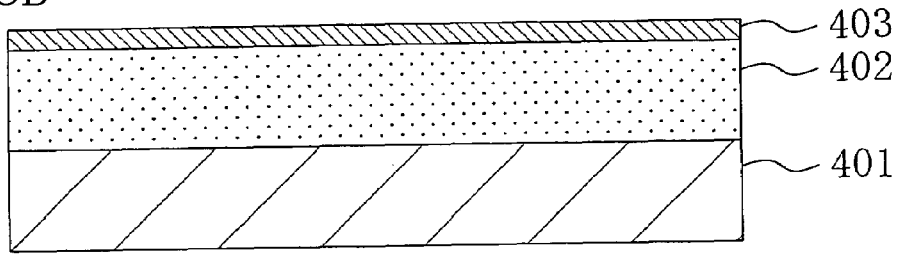

Then, as shown in FIG. 8B, a barrier film 403 that is made of a barrier film material having the following composition, has a thickness of 0.04 μm and is different in its solubility depending upon the value of pH is formed on the resist film 402 by, for example, the spin coating:

Alkali-soluble polymer: polyvinyl hexafluoroisopropyl alcohol . . . 1 g

Figure 8C:
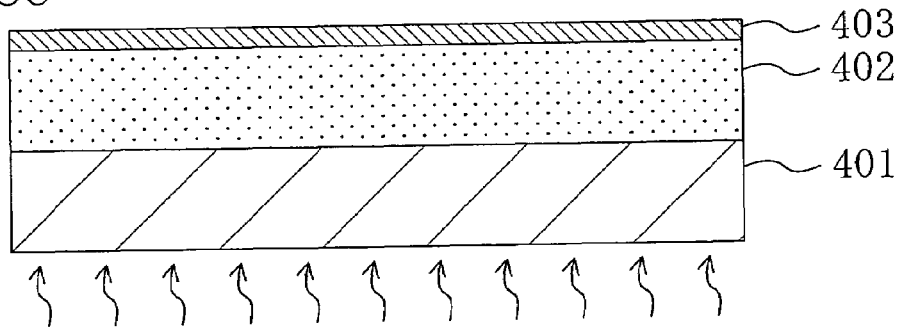

Fluorine-based surface active agent: 1,1-di(perfluoroisopropyl)-2-perfluoromethylethenylpolyoxyethylene ether . . . 0.0005 g Solvent: isobutyl alcohol . . . 20 g Next, as shown in FIG. 8C, the barrier film 403 is annealed with a hot plate at a temperature of 115° C. for 90 seconds, so as to improve the denseness of the barrier film 403.

Figure 8D:
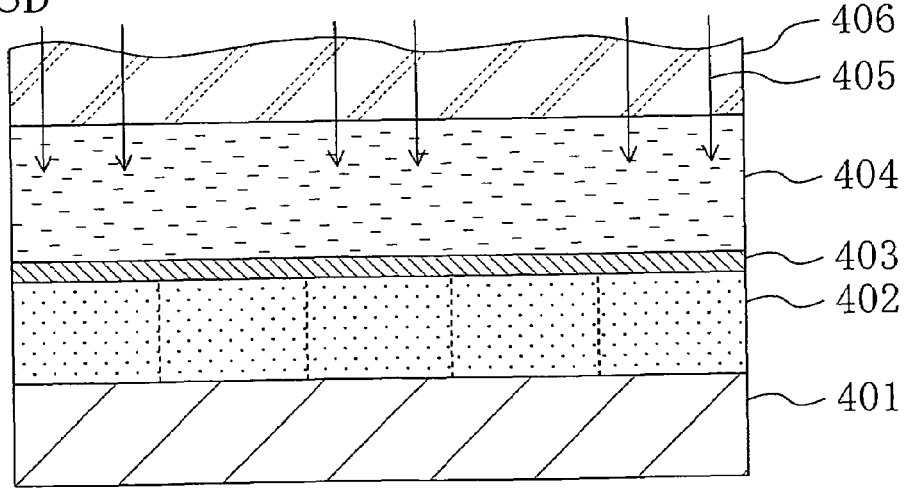

After the annealing, as shown in FIG. 8D, with an immersion liquid 404 of water provided between the barrier film 403 and a projection lens 406 by, for example, the puddle method, pattern exposure is carried out by irradiating the resist film 402 through the barrier film 403 with exposing light 405 of ArF excimer laser with NA of 0.68 having passed through a mask (not shown).

Figure 9A:
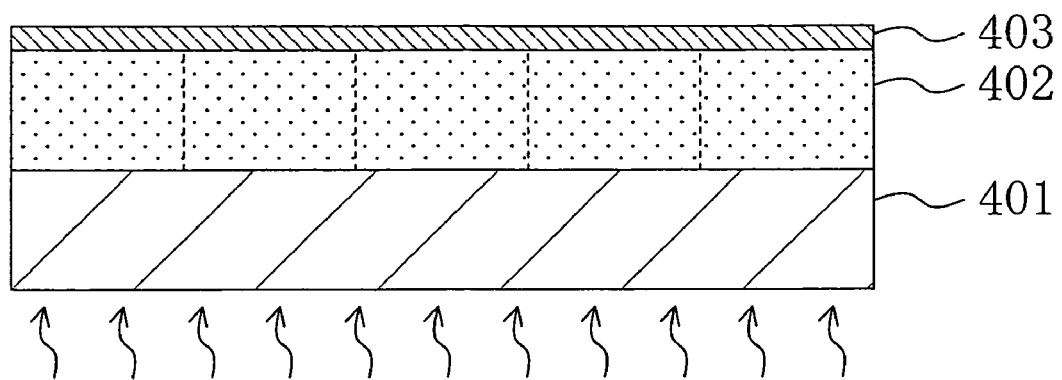
FIGS. 9A and 9B are cross-sectional views for showing other procedures in the pattern formation method using the barrier film material of Embodiment 4.

After the pattern exposure, as shown in FIG. 9A, the resist film 402 is baked with a hot plate at a temperature of 105° C. for 60 seconds (post exposure bake).

Figure 9B:
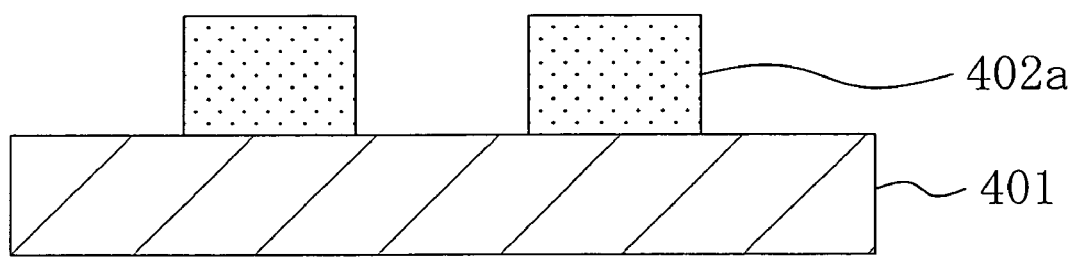

Next, the barrier film 403 is removed and the resultant resist film 402 is developed with a 2.38 wt % tetramethylammonium hydroxide aqueous solution (alkaline developer). In this manner, a resist pattern 402a made of an unexposed portion of the resist film 402 and having a line width of 0.09 μm is formed in a good shape as shown in FIG. 9B.

In this manner, according to Embodiment 4, before carrying out the pattern exposure shown in FIG. 8D, the barrier film 403 including the alkali-soluble polymer and the fluorine-based surface active agent is formed on the resist film 402. Therefore, the resist film 402 is never in direct contact with the immersion liquid 404. Accordingly, a component of the resist film 402 such as the acid generator or the quencher can be prevented from eluting into the immersion liquid 404 or the immersion liquid 404 can be prevented from permeating into the resist film 402 on the contrary, and hence, the resist film 402 keeps the expected performance of the chemically amplified resist through the exposure and the post exposure bake performed thereafter. As a result, the resist pattern 402a made of the resist film 402 is not degraded in its shape.

In addition, in Embodiment 4, since the barrier film 403 is annealed for improving the denseness as shown in FIG. 8C before the pattern exposure, the insolubility of the barrier film 403 in the immersion liquid 404 (water) is increased. Therefore, the function of the barrier film 403 as a barrier for preventing the acid generator or the like from eluting from the resist film 402 into the immersion liquid 404 can be improved.

Also, since the barrier film 403 is removed during the development, namely, with the alkaline developer, in the same manner as in Embodiment 3, the dissolution characteristic of the resist film 402 can be controlled.

Embodiment 5

A pattern formation method using a barrier film material according to Embodiment 5 of the invention will now be described with reference to FIGS. 10A through 10D, 11A and 11B.

Figure 10A:
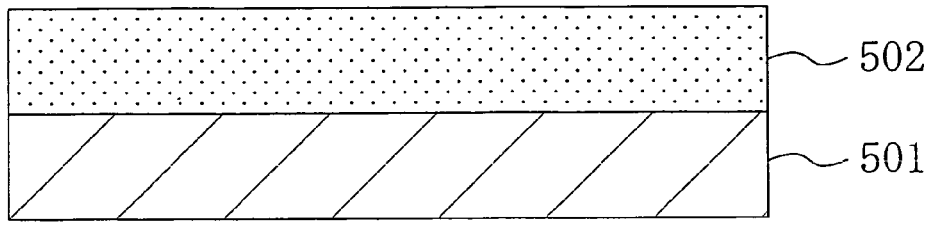
FIGS. 10A, 10B, 10C and 10D are cross-sectional views for showing procedures in a pattern formation method using a barrier film material according to Embodiment 5 of the invention.

First, a positive chemically amplified resist material having the following composition is prepared:

Base polymer: poly((styrenehexafluoroisopropyl alcohol) (40 mol %)-(α-trifluoromethyl-t-butylacrylate) (60 mol %)) . . . 2 g
Acid generator: triphenylsulfonium triflate . . . 0.06 g
Quencher: triethanolamine . . . 0.003 g
Solvent: propylene glycol monomethyl ether acetate . . . 20 g Next, as shown in FIG. 10A, the aforementioned chemically amplified resist material is applied on a substrate 501 so as to form a resist film 502 with a thickness of 0.15 μm.

Figure 10B:
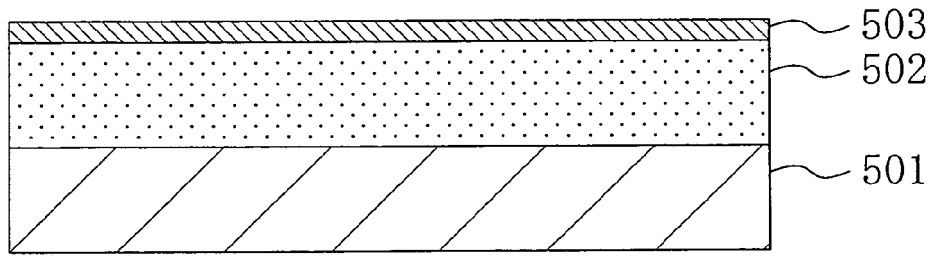
Figure 10C:
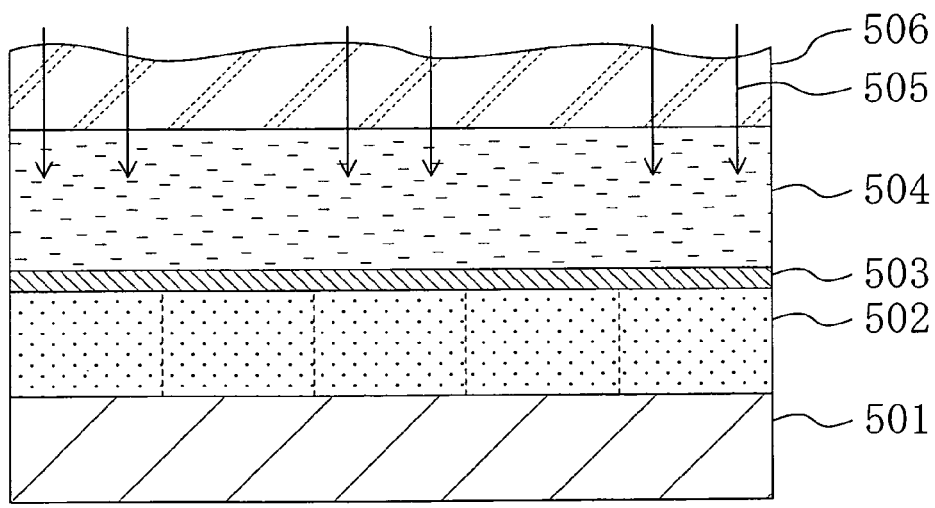

Then, as shown in FIG. 10B, a barrier film 503 that is made of a barrier film material having the following composition, has a thickness of 0.03 μm and is different in its solubility depending upon the value of pH is formed on the resist film 502 by, for example, the spin coating:

Alkali-soluble polymer: polyvinyl alcohol . . . 1 g
Fluorine-based surface active agent: 1,1-di(perfluoromethyl)-2-perfluoroethylethenyloxybenzyltrimethylammonium . . . . 0.0003 g
Solvent: isoamyl alcohol . . . 20 g Next, as shown in FIG. 10C, with an immersion liquid 504 of perfluoropolyether provided between the barrier film 503 and a projection lens 506 by, for example, the puddle method, pattern exposure is carried out by irradiating the resist film 502 through the barrier film 503 with exposing light 505 of $F_2$ laser with NA of 0.85 having passed through a mask (not shown).

Figure 10D:
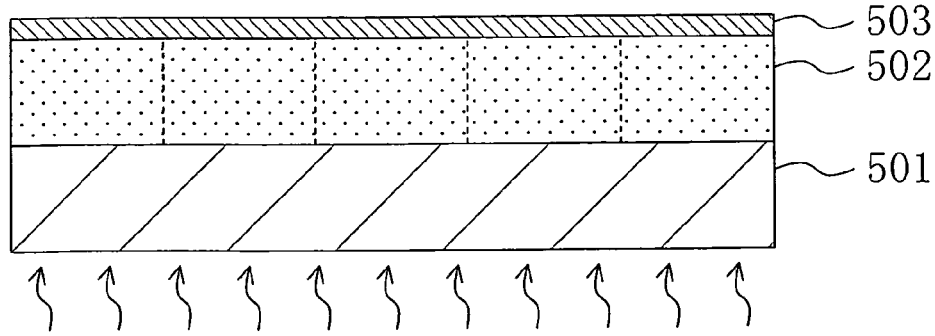

After the pattern exposure, as shown in FIG. 10D, the resist film 502 is baked with a hot plate at a temperature of 110° C. for 60 seconds (post exposure bake).

Figure 11A:
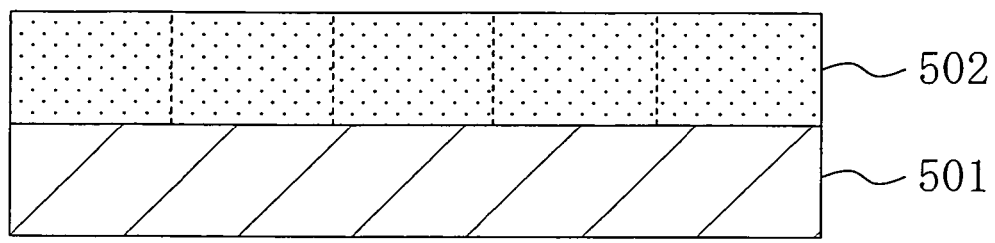
FIGS. 11A and 11B are cross-sectional views for showing other procedures in the pattern formation method using the barrier film material of Embodiment 5.
Figure 11B:
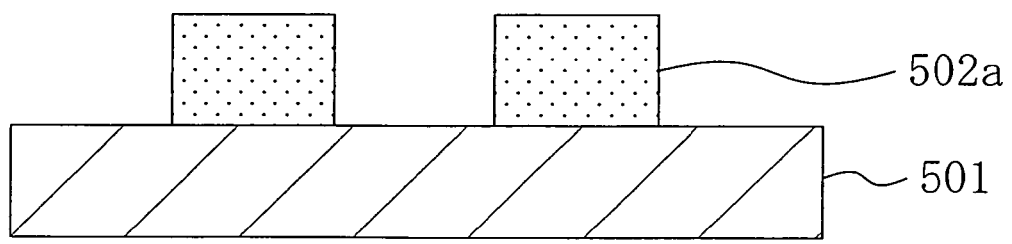

Next, as shown in FIG. 11A, the barrier film 503 is removed with, for example, a 0.01 wt % tetramethylammonium hydroxide aqueous solution (diluted alkaline developer) and thereafter, the resultant resist film 502 is developed with a 2.38 wt % tetramethylammonium hydroxide aqueous solution (alkaline developer). In this manner, a resist pattern 502a made of an unexposed portion of the resist film 502 and having a line width of 0.07 μm is formed in a good shape as shown in FIG. 11B.

In this manner, according to Embodiment 5, before carrying out the pattern exposure shown in FIG. 10C, the barrier film 503 including the alkali-soluble polymer and the fluorine-based surface active agent is formed on the resist film 502. Therefore, the resist film 502 is never in direct contact with the immersion liquid 504. Accordingly, a component of the resist film 502 such as the acid generator or the quencher can be prevented from eluting into the immersion liquid 504 or the immersion liquid 504 can be prevented from permeating into the resist film 502 on the contrary, and hence, the resist film 502 keeps the expected performance of the chemically amplified resist through the exposure and the post exposure bake performed thereafter. As a result, the resist pattern 502a made of the resist film 502 is not degraded in its shape.

Also in Embodiment 5, the annealing for improving the denseness may be performed on the barrier film 503 before the pattern exposure.

Also, in the same manner as in Embodiments 3 and 4, the barrier film 503 may be removed not before the development but during the development.

In each of Embodiments 1 through 5, the alkali-soluble polymer included in the barrier film is polyvinyl hexafluoroisopropyl alcohol, polyvinyl alcohol, polyvinyl pyrrolidone, polyacrylic acid or polystyrenesulfonic acid, and apart from these polymers, hydroxyethyl cellulose, polyisoprenesulfonic acid or pullulan may be used.

Furthermore, the fluorine-based surface active agent included in the barrier film is not limited to those used in Embodiments 1 through 5 but may be a surface active agent having a group with a double bond, such as a surface active agent having a perfluoroalkenyl group.

Embodiment 6

A pattern formation method using a barrier film material according to Embodiment 6 of the invention will now be described with reference to FIGS. 12A through 12D, 13A and 13B.

Figure 12A:
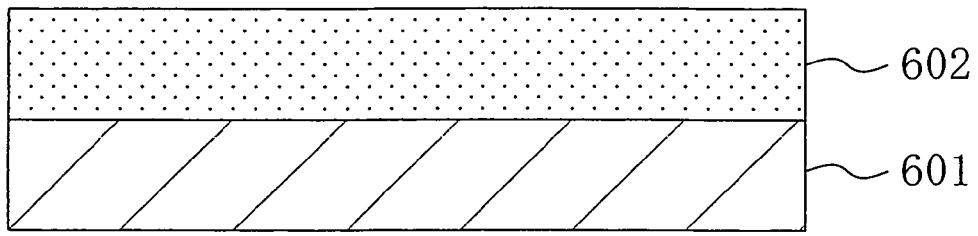
FIGS. 12A, 12B, 12C and 12D are cross-sectional views for showing procedures in a pattern formation method using a barrier film material according to Embodiment 6 of the invention.

First, a positive chemically amplified resist material having the following composition is prepared:

Base polymer: poly((norbornene-5-methylene-t-butylcarboxylate) (50 mol %)-(maleic anhydride) (50 mol %)) . . . 2 g
Acid generator: triphenylsulfonium triflate . . . 0.06 g
Quencher: triethanolamine . . . 0.002 g
Solvent: propylene glycol monomethyl ether acetate . . . 20 g Next, as shown in FIG. 12A, the aforementioned chemically amplified resist material is applied on a substrate 601 so as to form a resist film 602 with a thickness of 0.35 μm.

Figure 12B:
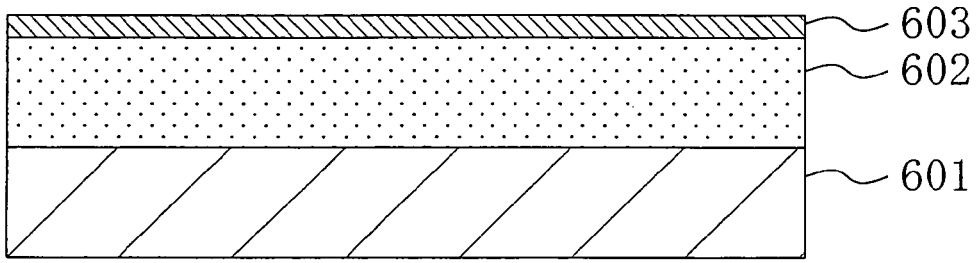

Then, as shown in FIG. 12B, a barrier film 603 that is made of a barrier film material having the following composition, has a thickness of 0.07 μm and is different in its solubility depending upon the value of pH is formed on the resist film 602 by, for example, the spin coating:

Polymer: polyvinyl sulfonamide . . . 1 g
Solvent: isopropyl alcohol . . . 20 g

Figure 12C:
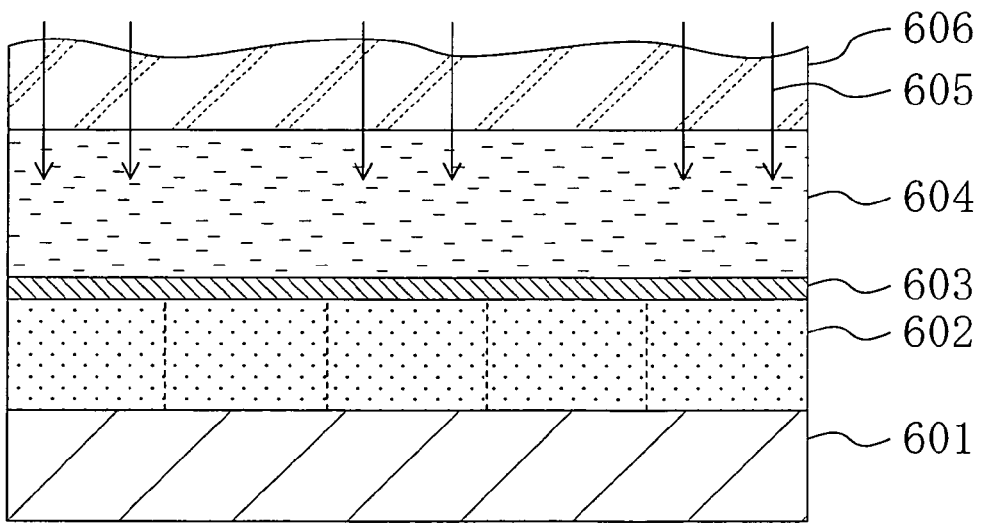

Next, as shown in FIG. 12C, with an immersion liquid 604 of water provided between the barrier film 603 and a projection lens 606 by, for example, the puddle method, pattern exposure is carried out by irradiating the resist film 602 through the barrier film 603 with exposing light 605 of ArF excimer laser with NA of 0.68 having passed through a mask (not shown).

Figure 12D:
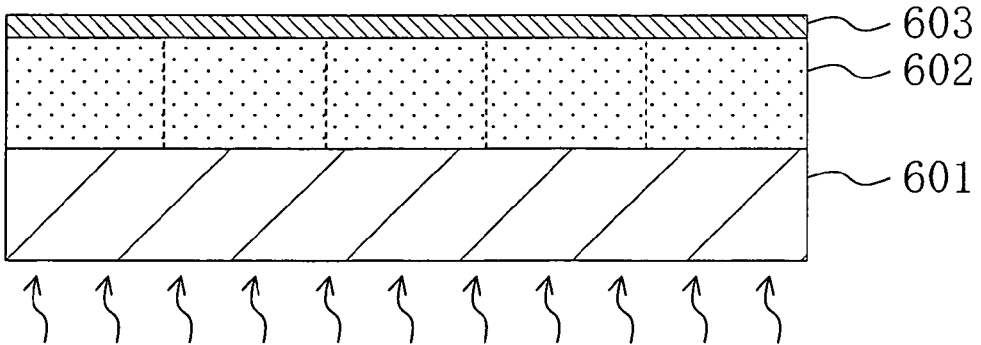

After the pattern exposure, as shown in FIG. 12D, the resist film 602 is baked with a hot plate at a temperature of 105° C. for 60 seconds (post exposure bake).

Figure 13A:
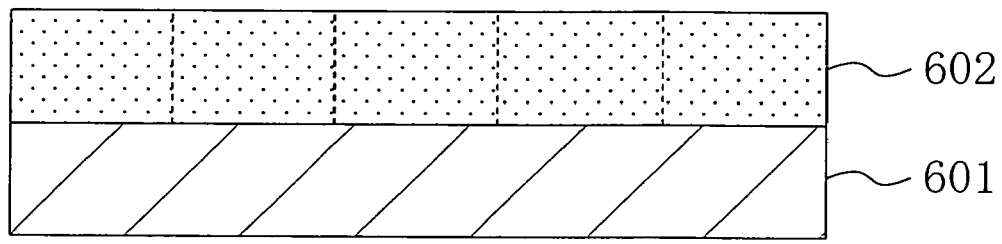
FIGS. 13A and 13B are cross-sectional views for showing other procedures in the pattern formation method using the barrier film material of Embodiment 6.
Figure 13B:
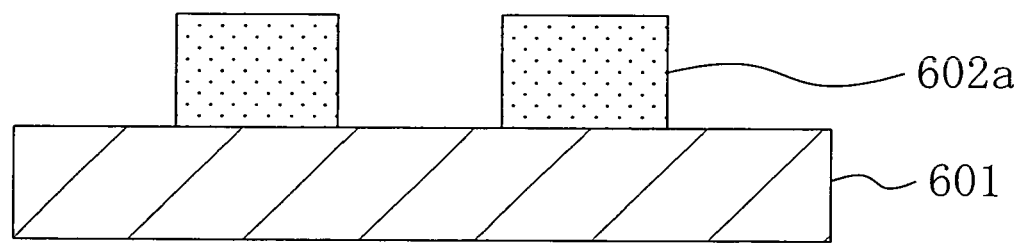

Next, as shown in FIG. 13A, the barrier film 603 is removed with, for example, a 0.01 wt % tetramethylammonium hydroxide aqueous solution (diluted alkaline developer). Thereafter, the resultant resist film 602 is developed with a 2.38 wt % tetramethylammonium hydroxide aqueous solution (alkaline developer). In this manner, a resist pattern 602a made of an unexposed portion of the resist film 602 and having a line width of 0.09 μm is formed in a good shape as shown in FIG. 13B.

In this manner, according to Embodiment 6, before carrying out the pattern exposure shown in FIG. 12C, the barrier film 603 including the polymer having a sulfonamide structure (i.e., polyvinyl sulfonamide) is formed on the resist film 602. Therefore, the resist film 602 is never in direct contact with the immersion liquid 604. Accordingly, a component of the resist film 602 such as the acid generator or the quencher can be prevented from eluting into the immersion liquid 604 or the immersion liquid 604 can be prevented from permeating into the resist film 602 on the contrary, and hence, the resist film 602 keeps the expected performance of the chemically amplified resist through the exposure and the post exposure bake performed thereafter. As a result, the resist pattern 602a made of the resist film 602 is not degraded in its shape.

Embodiment 7

A pattern formation method using a barrier film material according to Embodiment 7 of the invention will now be described with reference to FIGS. 14A through 14D and 15A through 15C.

Figure 14A:
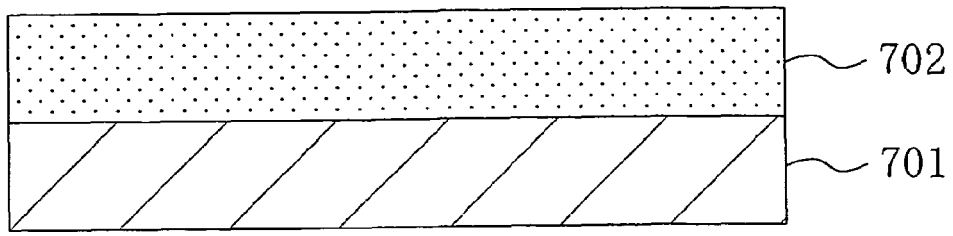
FIGS. 14A, 14B, 14C and 14D are cross-sectional views for showing procedures in a pattern formation method using a barrier film material according to Embodiment 7 of the invention.

First, a positive chemically amplified resist material having the following composition is prepared:

Base polymer: poly((norbornene-5-methylene-t-butylcarboxylate) (50 mol %)-(maleic anhydride) (50 mol %)) . . . 2 g
Acid generator: triphenylsulfonium triflate . . . 0.06 g
Quencher: triethanolamine . . . 0.002 g
Solvent: propylene glycol monomethyl ether acetate . . . 20 g Next, as shown in FIG. 14A, the aforementioned chemically amplified resist material is applied on a substrate 701 so as to form a resist film 702 with a thickness of 0.35 µm.

Figure 14B:
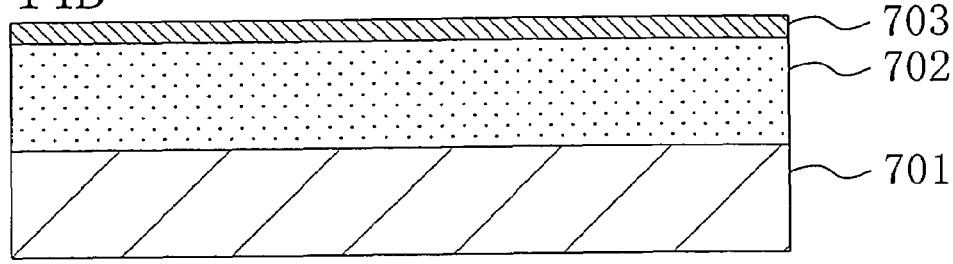
Figure 14C:
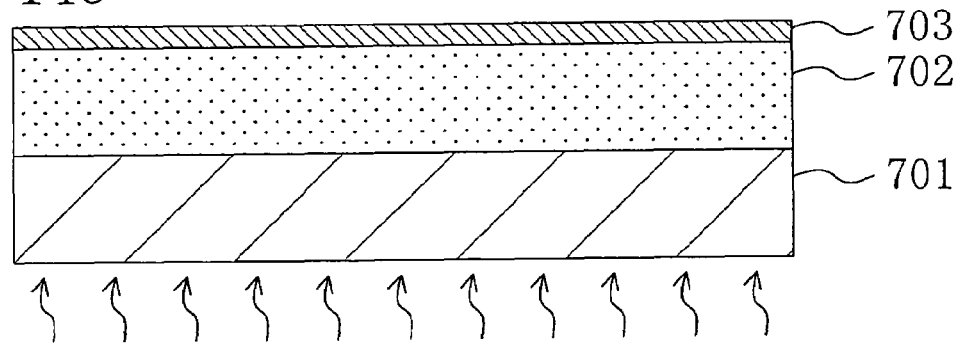

Then, as shown in FIG. 14B, a barrier film 703 that is made of a barrier film material having the following composition, has a thickness of 0.06 µm and is different in its solubility depending upon the value of pH is formed on the resist film 702 by, for example, the spin coating:

Polymer: polyvinyl sulfone-N-ethylamide . . . 1 g
Solvent: n-butyl alcohol . . . 20 g Next, as shown in FIG. 14C, the barrier film 703 is annealed with a hot plate at a temperature of 120° C. for 90 seconds, so as to improve the denseness of the barrier film 703.

Figure 14D:
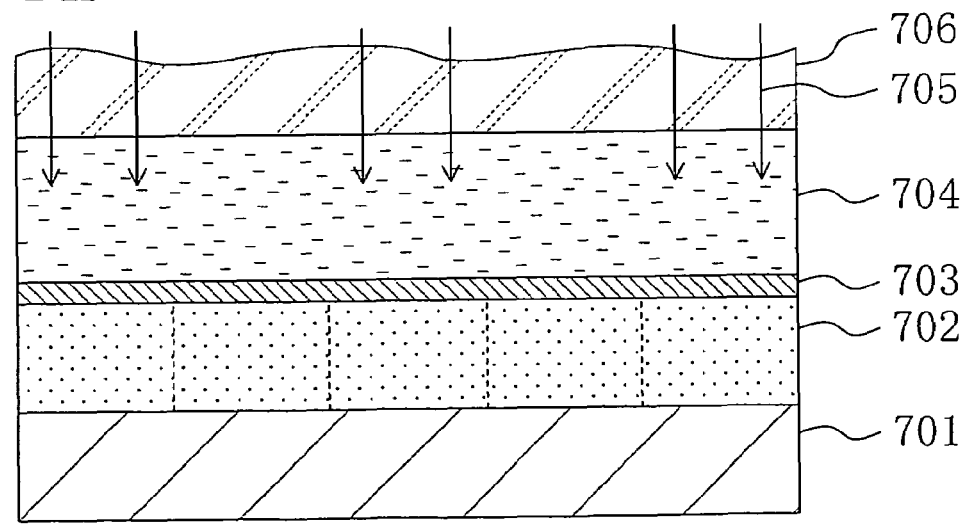

After the annealing, as shown in FIG. 14D, with an immersion liquid 704 of water provided between the barrier film 703 and a projection lens 706 by, for example, the puddle method, pattern exposure is carried out by irradiating the resist film 702 through the barrier film 703 with exposing light 705 of ArF excimer laser with NA of 0.68 having passed through a mask (not shown).

Figure 15A:
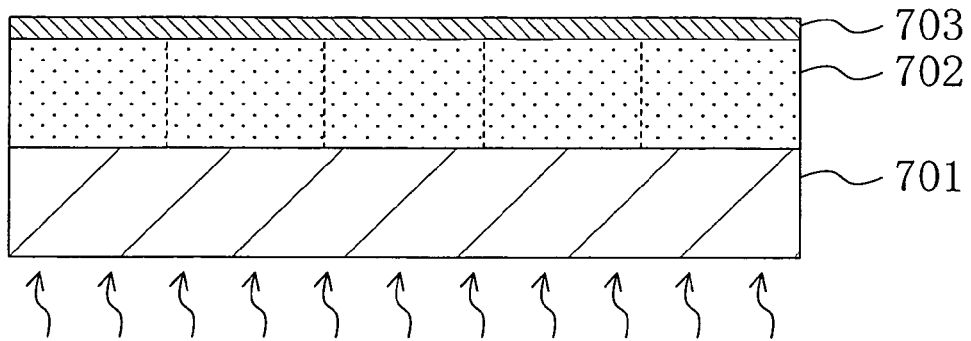
FIGS. 15A, 15B and 15C are cross-sectional views for showing other procedures in the pattern formation method using the barrier film material of Embodiment 7.

After the pattern exposure, as shown in FIG. 15A, the resist film 702 is baked with a hot plate at a temperature of 105° C. for 60 seconds (post exposure bake).

Figure 15B:
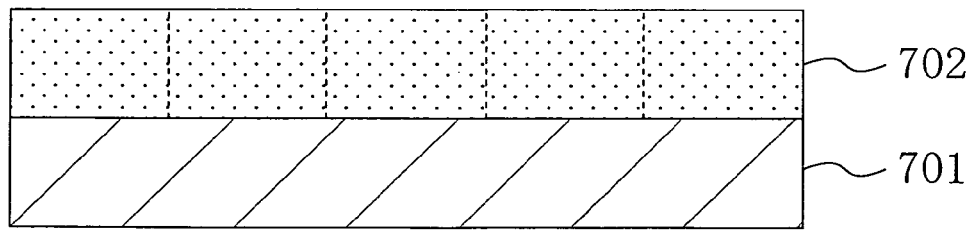
Figure 15C:
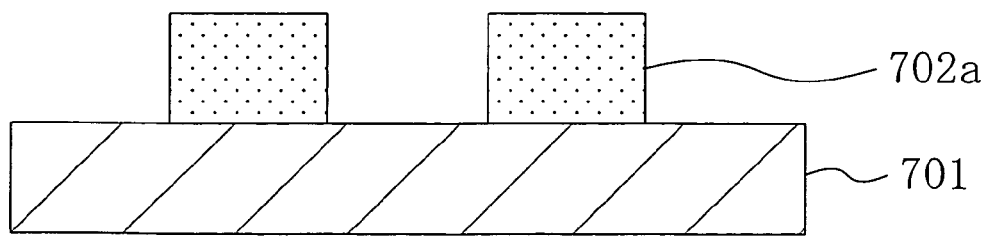

Next, as shown in FIG. 15B, the barrier film 703 is removed with, for example, a 0.005 wt % tetramethylammonium hydroxide aqueous solution (diluted alkaline developer). Thereafter, the resultant resist film 702 is developed with a 2.38 wt % tetramethylammonium hydroxide aqueous solution (alkaline developer). In this manner, a resist pattern 702a made of an unexposed portion of the resist film 702 and having a line width of 0.09 µm is formed in a good shape as shown in FIG. 15C.

In this manner, according to Embodiment 7, before carrying out the pattern exposure shown in FIG. 14D, the barrier film 703 including the polymer having a sulfonamide structure (i.e., polyvinyl sulfone-N-ethylamide) is formed on the resist film 702. Therefore, the resist film 702 is never in direct contact with the immersion liquid 704. Accordingly, a component of the resist film 702 such as the acid generator or the quencher can be prevented from eluting into the immersion liquid 704 or the immersion liquid 704 can be prevented from permeating into the resist film 702 on the contrary, and hence, the resist film 702 keeps the expected performance of the chemically amplified resist through the exposure and the post exposure bake performed thereafter. As a result, the resist pattern 702a made of the resist film 702 is not degraded in its shape.

In addition, in Embodiment 7, since the barrier film 703 is annealed for improving the denseness as shown in FIG. 14C before the pattern exposure, the insolubility of the barrier film 703 in the immersion liquid 704 (water) is increased. Therefore, the function of the barrier film 703 as a barrier for preventing the acid generator or the like from eluting from the resist film 702 into the immersion liquid 704 can be improved.

Embodiment 8

A pattern formation method using a barrier film material according to Embodiment 8 of the invention will now be described with reference to FIGS. 16A through 16D and 17.

Figure 16A:
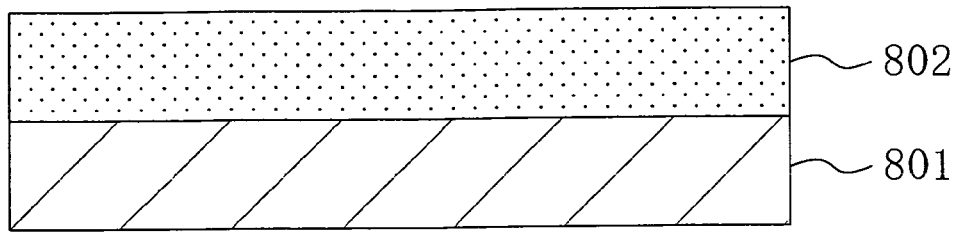
FIGS. 16A, 16B, 16C and 16D are cross-sectional views for showing procedures in a pattern formation method using a barrier film material according to Embodiment 8 of the invention.

First, a positive chemically amplified resist material having the following composition is prepared:

Base polymer: poly((norbornene-5-methylene-t-butylcarboxylate) (50 mol %)-(maleic anhydride) (50 mol %)) . . . 2 g
Acid generator: triphenylsulfonium triflate . . . 0.06 g
Quencher: triethanolamine . . . 0.002 g
Solvent: propylene glycol monomethyl ether acetate . . . 20 g Next, as shown in FIG. 16A, the aforementioned chemically amplified resist material is applied on a substrate 801 so as to form a resist film 802 with a thickness of 0.35 µm.

Figure 16B:
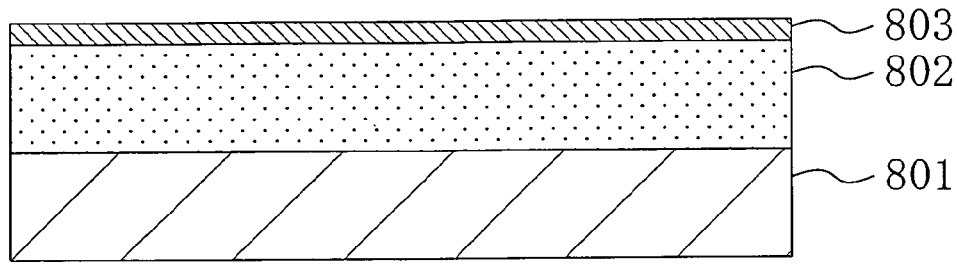
Figure 16C:
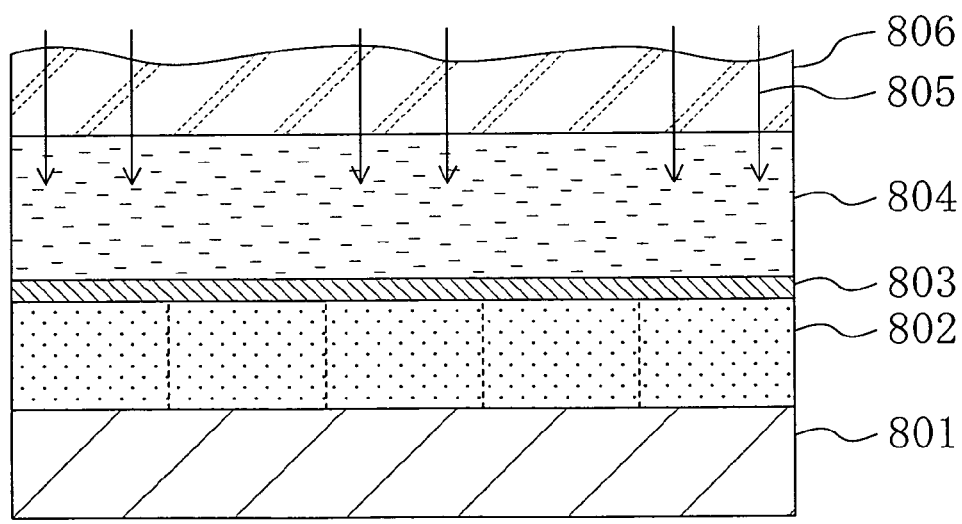

Then, as shown in FIG. 16B, a barrier film 803 that is made of a barrier film material having the following composition, has a thickness of 0.07 µm and is different in its solubility depending upon the value of pH is formed on the resist film 802 by, for example, the spin coating:

Polymer: polyvinyl sulfone-N-chloromethylamide . . . 1 g
Solvent: isopropyl alcohol . . . 20 g Next, as shown in FIG. 16C, with an immersion liquid 804 of water provided between the barrier film 803 and a projection lens 806 by, for example, the puddle method, pattern exposure is carried out by irradiating the resist film 802 through the barrier film 803 with exposing light 805 of ArF excimer laser with NA of 0.68 having passed through a mask (not shown).

Figure 16D:
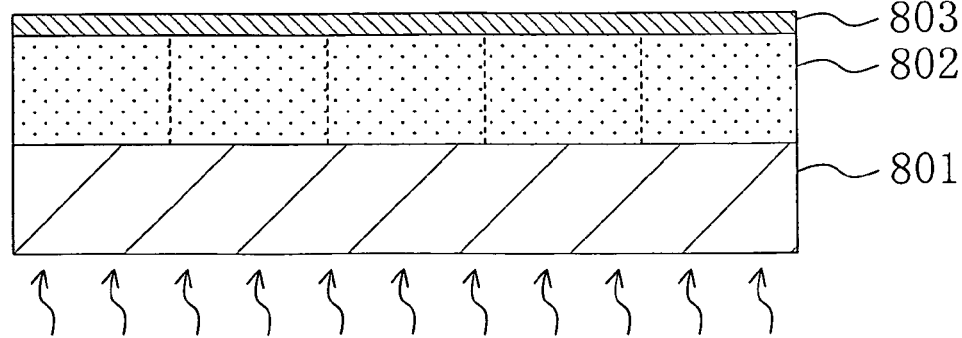

After the pattern exposure, as shown in FIG. 16D, the resist film 802 is baked with a hot plate at a temperature of 105° C. for 60 seconds (post exposure bake).

Figure 17:
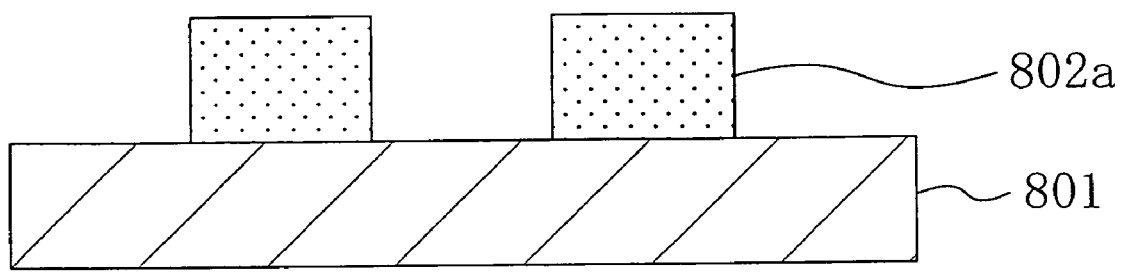
FIG. 17 is a cross-sectional view for showing another procedure in the pattern formation method using the barrier film material of Embodiment 8.

Next, the barrier film 803 is removed and the resultant resist film 802 is developed with a 2.38 wt % tetramethylammonium hydroxide aqueous solution (alkaline developer). In this manner, a resist pattern 802a made of an unexposed portion of the resist film 802 and having a line width of 0.09 µm is formed in a good shape as shown in FIG. 17.

In this manner, according to Embodiment 8, before carrying out the pattern exposure shown in FIG. 16C, the barrier film 803 including the polymer having a sulfonamide structure (i.e., polyvinyl sulfone-N-chloromethylamide) is formed on the resist film 802. Therefore, the resist film 802 is never in direct contact with the immersion liquid 804. Accordingly, a component of the resist film 802 such as the acid generator or the quencher can be prevented from eluting into the immersion liquid 804 or the immersion liquid 804 can be prevented from permeating into the resist film 802 on the contrary, and hence, the resist film 802 keeps the expected performance of the chemically amplified resist through the exposure and the post exposure bake performed thereafter. As a result, the resist pattern 802a made of the resist film 802 is not degraded in its shape.

Furthermore, in the same manner as in Embodiment 3, since the barrier film 803 is removed during the development, namely, with the alkaline developer, the dissolution characteristic of the resist film 802 can be controlled.

Embodiment 9

A pattern formation method using a barrier film material according to Embodiment 9 of the invention will now be described with reference to FIGS. 18A through 18D, 19A and 19B.

Figure 18A:
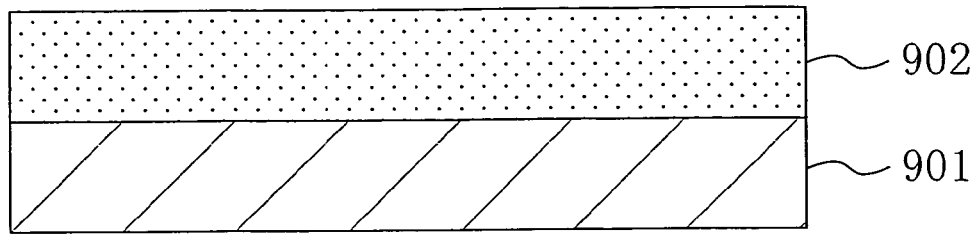
FIGS. 18A, 18B, 18C and 18D are cross-sectional views for showing procedures in a pattern formation method using a barrier film material according to Embodiment 9 of the invention.

First, a positive chemically amplified resist material having the following composition is prepared:

Base polymer: poly((norbornene-5-methylene-t-butylcarboxylate) (50 mol %)-(maleic anhydride) (50 mol %)) . . . 2 g
   Acid generator: triphenylsulfonium triflate . . . 0.06 g
   Quencher: triethanolamine . . . 0.002 g
   Solvent: propylene glycol monomethyl ether acetate . . . 20 g Next, as shown in FIG. 18A, the aforementioned chemically amplified resist material is applied on a substrate 901 so as to form a resist film 902 with a thickness of 0.35 µm.

Figure 18B:
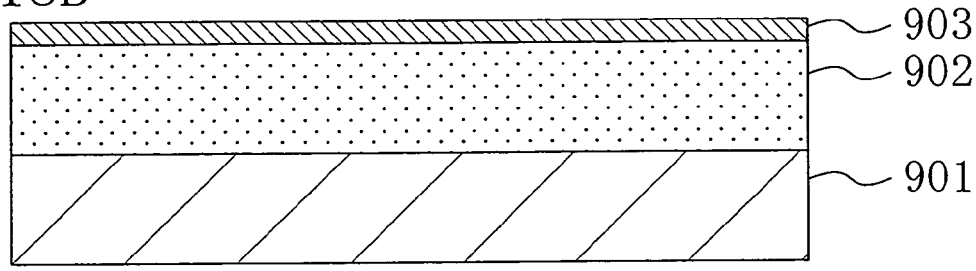
Figure 18C:
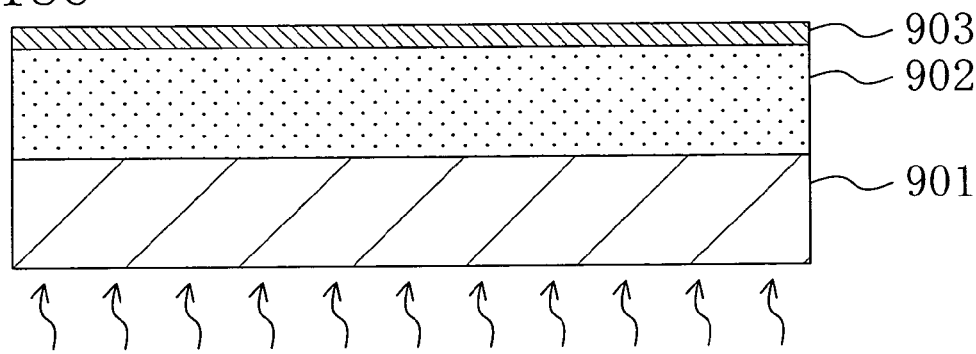

Then, as shown in FIG. 18B, a barrier film 903 that is made of a barrier film material having the following composition, has a thickness of 0.08 µm and is different in its solubility depending upon the value of pH is formed on the resist film 902 by, for example, the spin coating:

Polymer: polyvinyl sulfone-N-hydroxyethylamide . . . 1 g
Solvent: n-amyl alcohol . . . 20 g Next, as shown in FIG. 18C, the barrier film 903 is annealed with a hot plate at a temperature of 115° C. for 90 seconds, so as to improve the denseness of the barrier film 903.

Figure 18D:
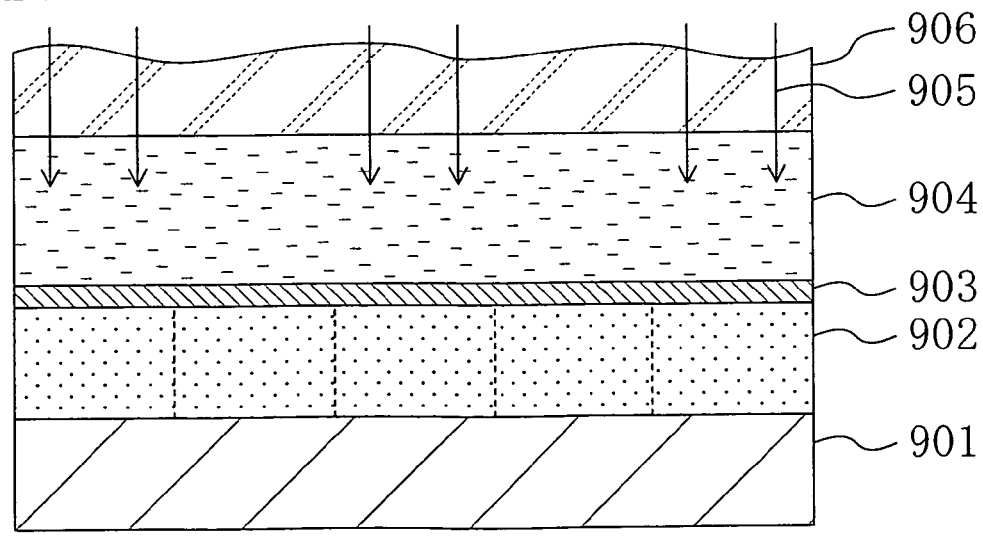

After the annealing, as shown in FIG. 18D, with an immersion liquid 904 of water provided between the barrier film 903 and a projection lens 906 by, for example, the puddle method, pattern exposure is carried out by irradiating the resist film 902 through the barrier film 903 with exposing light 905 of ArF excimer laser with NA of 0.68 having passed through a mask (not shown).

Figure 19A:
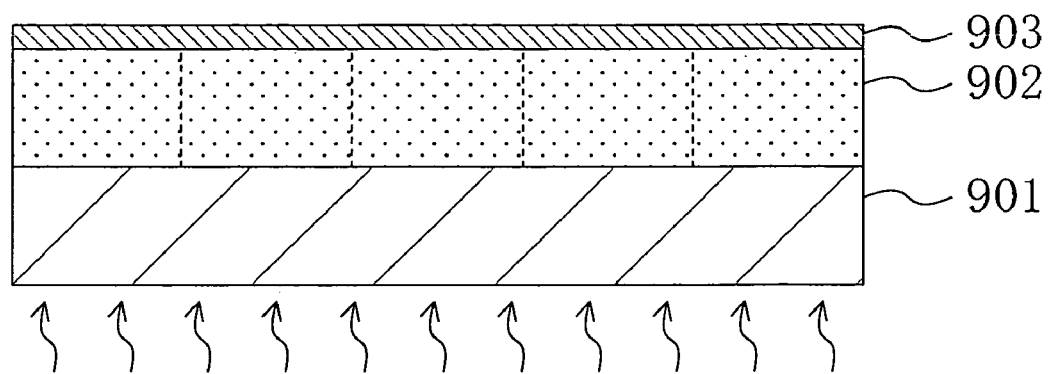
FIGS. 19A and 19B are cross-sectional views for showing other procedures in the pattern formation method using the barrier film material of Embodiment 9.

After the pattern exposure, as shown in FIG. 19A, the resist film 902 is baked with a hot plate at a temperature of 105° C. for 60 seconds (post exposure bake).

Figure 19B:
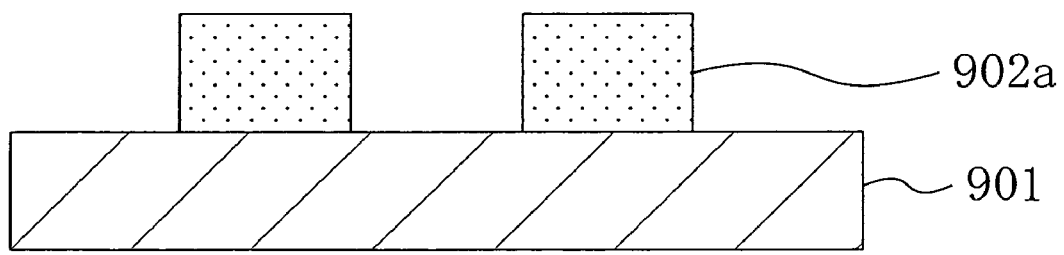
Figure 20A:
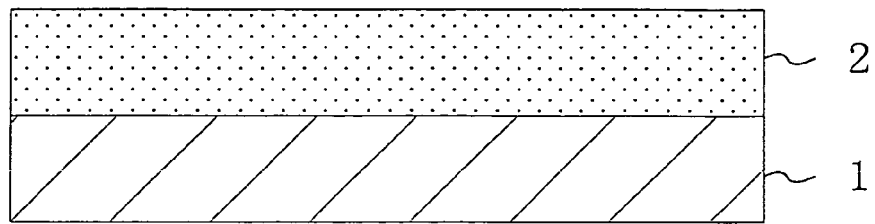
FIGS. 20A, 20B, 20C and 20D are cross-sectional views for showing procedures in a conventional pattern formation method employing immersion lithography.
Figure 20B:
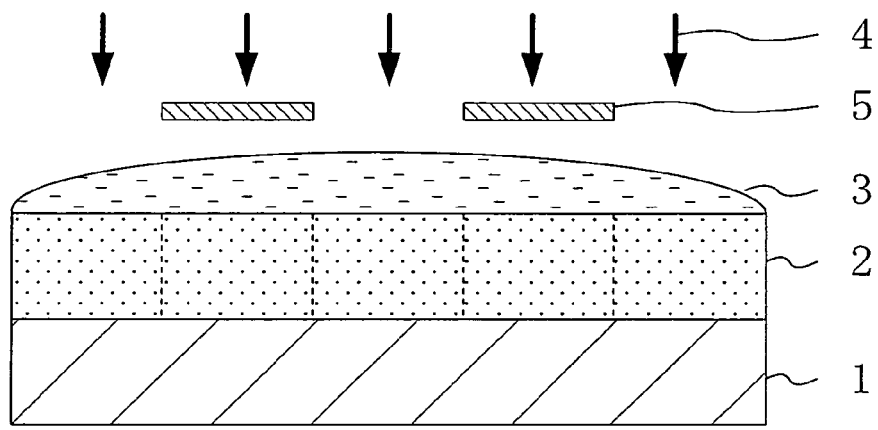
Figure 20C:
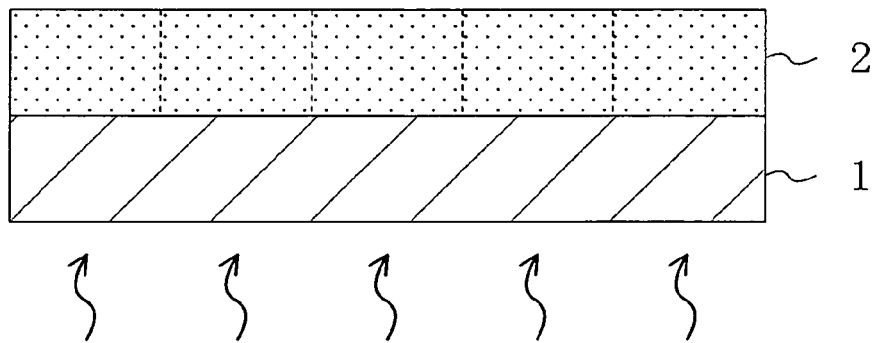
Figure 20D:
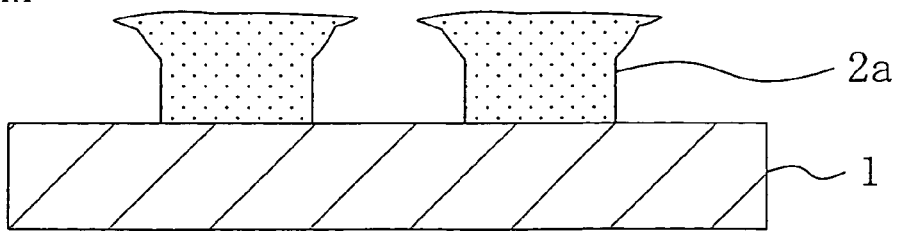

Next, the barrier film 903 is removed and the resultant resist film 902 is developed with a 2.38 wt % tetramethylammonium hydroxide aqueous solution (alkaline developer). In this manner, a resist pattern 902a made of an unexposed portion of the resist film 902 and having a line width of 0.09 µm is formed in a good shape as shown in FIG. 19B.

In this manner, according to Embodiment 9, before carrying out the pattern exposure shown in FIG. 18D, the barrier film 903 including the polymer having a sulfonamide structure (i.e., polyvinyl sulfone-N-hydroxyethylamide) is formed on the resist film 902. Therefore, the resist film 902 is never in direct contact with the immersion liquid 904. Accordingly, a component of the resist film 902 such as the acid generator or the quencher can be prevented from eluting into the immersion liquid 904 or the immersion liquid 904 can be prevented from permeating into the resist film 902 on the contrary, and hence, the resist film 902 keeps the expected performance of the chemically amplified resist through the exposure and the post exposure bake performed thereafter. As a result, the resist pattern 902a made of the resist film 902 is not degraded in its shape.

In addition, in Embodiment 9, since the barrier film 903 is annealed for improving the denseness as shown in FIG. 18C before the pattern exposure, the insolubility of the barrier film 903 in the immersion liquid 904 (water) is increased. Therefore, the function of the barrier film 903 as a barrier for preventing the acid generator or the like from eluting from the resist film 902 into the immersion liquid 904 can be improved.

Furthermore, since the barrier film 903 is removed during the development, namely, with the alkaline developer, in the same manner as in Embodiment 3, the dissolution characteristic of the resist film 902 can be controlled.

Although the exposing light is ArF excimer laser in Embodiments 1 through 4 and 6 through 9 and is $F_2$ laser in Embodiment 5, the exposing light is not limited to them but may be KrF excimer laser, ArKr laser or $Ar_2$ laser instead.

Furthermore, in each of Embodiments 1 through 9, the refractive index of the immersion liquid may be increased by adding, for example, cesium sulfate ($Cs_2SO_4$) or phosphoric acid ($H_3PO_4$) to the immersion liquid. In this case, the concentration of the cesium sulfate or the phosphoric acid is approximately 1 wt % through 10 wt %, which does not limit the invention.

Also, the thickness of the barrier film is not limited to the thickness employed in each embodiment, which is specifically 0.03 µm through 0.08 µm. The lower limit of the thickness is a thickness sufficiently larger for preventing a component of the resist film from eluting into the immersion liquid or preventing the immersion liquid from permeating into the resist film, and the upper limit of the thickness is a thickness sufficiently smaller for not preventing transmittance of the exposing light but to be easily removed. For example, the thickness is preferably 0.01 µm through 0.15 µm and more preferably approximately 0.02 µm through 0.10 µm, which does not limit the invention.

Furthermore, the puddle method is employed for providing the immersion liquid onto the barrier film in each embodiment, which does not limit the invention, and for example, a dip method in which the whole substrate is dipped in the immersion liquid may be employed instead.

Moreover, although a positive chemically amplified resist is used for forming the resist film in each embodiment, the present invention is applicable also to a negative chemically amplified resist.

As described so far, according to the barrier film material and the pattern formation method using the same of this invention, the influence of an immersion liquid on a resist film can be prevented, so that a resist pattern can be formed in a good shape. Accordingly, the present invention is useful as a method for forming a fine pattern to be employed in fabrication process or the like for semiconductor devices.

What is claimed is:

1. A pattern formation method comprising the steps of:
forming a resist film made of a chemically amplified resist on a substrate;
forming a barrier film on said resist film;
performing pattern exposure by selectively irradiating said resist film with exposing light with a liquid provided on said barrier film;
removing said barrier film; and
forming a resist pattern made of said resist film by developing said resist film after removing said barrier film,
wherein said barrier film includes an alkali-soluble polymer and a fluorine-based surface active agent, and said barrier film prevents a component of said resist film from eluting into said liquid or prevents said liquid from permeating into said resist film.

2. The pattern formation method of claim 1, further comprising, before the step of performing pattern exposure, a step of annealing said barrier film.

3. The pattern formation method of claim 1, wherein said barrier film has solubility different depending upon a value of hydrogen ion exponent (pH).

4. The pattern formation method of claim 3, wherein said barrier film is soluble in a solution with a value of hydrogen ion exponent (pH) larger than 7.

5. The pattern formation method of claim 3, wherein said barrier film includes a polymer having a sulfonamide structure.

6. The pattern formation method of claim 5, wherein said polymer is polyvinyl sulfonamide or a polysulfonamide derivative.

7. The pattern formation method of claim 6, wherein said polyvinyl sulfonamide derivative is polyvinylsulfone alkylamide, polyvinylsulfone alkylamide fluoride or polyvinylsulfone substituted alkylamide.

8. The pattern formation method of claim 7, wherein a substituent group of said polyvinylsulfone substituted alkylamide is a hydroxyl group, an alkoxy group, an oxo group, an amino group or an alkylamino group.

9. The pattern formation method of claim 1, wherein said alkali-soluble polymer is at least one of polyvinyl hexafluoroisopropyl alcohol, polyvinyl alcohol, polyacrylic acid, polystyrenesulfonic acid, hydroxyethyl cellulose, polyisoprenesulfonic acid, polyvinyl pyrrolidone and pullulan.

10. The pattern formation method of claim 1, wherein said fluorine-based surface active agent has a group with a double bond.

11. The pattern formation method of claim 10, wherein said group with a double bond is a perfluoroalkenyl group.

12. The pattern formation method of claim 11, wherein said perfluoroalkenyl group is a 1,1-di(perfluoromethyl)-2-perfluoroethylethenyl group or a 1,1-di(perfluoroisopropyl)-2-perfluoromethylethenyl group.

13. The pattern formation method of claim 12, wherein said fluorine-based surface active agent having said 1,1-di(perfluoromethyl)-2-perfluoroethylethenyl group is 1,1-di(perfluoromethyl)-2-perfluoroethylethenyloxybenzyltrimethylammonium or 1,1-di(perfluoromethyl)-2-perfluoroethylethenylpolyoxyethylene ether.

14. The pattern formation method of claim 12, wherein said fluorine-based surface active agent having said 1,1-di(perfluoroisopropyl)-2-perfluoromethylethenyl group is 1,1-di(perfluoroisopropyl)-2-perfluoromethylethenyloxybenzyltrimethylammonium or 1,1-di(perfluoroisopropyl)-2-perfluoromethylethenylpolyoxyethylene ether.

15. The pattern formation method of claim 1, wherein said liquid is water or perfluoropolyether.

16. The pattern formation method of claim 1, wherein said liquid is an acidic solution.

17. The pattern formation method of claim 16, wherein said acidic solution is a phosphoric acid aqueous solution or a cesium sulfate aqueous solution.

18. The pattern formation method of claim 1, wherein said exposing light is KrF excimer laser, ArF excimer laser, $F_2$ laser, ArKr laser or $Ar_2$ laser.

19. The pattern formation method of claim 1, wherein the thickness of the barrier film is between 0.01 μm and 0.15 μm.

20. The pattern formation method of claim 2, wherein the annealing temperature of the barrier film is in the range of 100° C. to 150° C.

21. The pattern formation method of claim 1, wherein the liquid is provided on the barrier film by a puddle method.

22. A pattern formation method comprising the steps of:
forming a resist film made of a chemically amplified resist on a substrate;
forming a barrier film on said resist film;
performing pattern exposure by selectively irradiating said resist film with exposing light with a liquid provided on said barrier film; and
removing said barrier film and forming a resist pattern made of said resist film by developing said resist film after the pattern exposure,
wherein said barrier film includes an alkali-soluble polymer and a fluorine-based surface active agent, and
said barrier film prevents a component of said resist film from eluting into said liquid or prevents said liquid from permeating into said resist film.

23. The pattern formation method of claim 22, further comprising, before the step of performing pattern exposure, a step of annealing said barrier film.

24. The pattern formation method of claim 22, wherein said barrier film has solubility different depending upon a value of hydrogen ion exponent (pH).

25. The pattern formation method of claim 24, wherein said barrier film is soluble in a solution with a value of hydrogen ion exponent (pH) larger than 7.

26. The pattern formation method of claim 24, wherein said barrier film includes a polymer having a sulfonamide structure.

27. The pattern formation method of claim 26, wherein said polymer is polyvinyl sulfonamide or a polyvinyl sulfonamide derivative.

28. The pattern formation method of claim 27, wherein said polyvinyl sulfonamide derivative is polyvinylsulfone alkylamide, polyvinylsulfone alkylamide fluoride or polyvinylsulfone substituted alkylamide.

29. The pattern formation method of claim 28, wherein a substituent group of said polyvinylsulfone substituted alkylamide is a hydroxyl group, an alkoxy group, an oxo group, an amino group or an alkylamino group.

30. The pattern formation method of claim 22, wherein said alkali-soluble polymer is at least one of polyvinyl hexafluoroisopropyl alcohol, polyvinyl alcohol, polyacrylic acid, polystyrenesulfonic acid, hydroxyethyl cellulose, polyisoprenesulfonic acid, polyvinyl pyrrolidone and pullulan.

31. The pattern formation method of claim 22, wherein said fluorine-based surface active agent has a group with a double bond.

32. The pattern formation method of claim 31, wherein said group with a double bond is a perfluoroalkenyl group.

33. The pattern formation method of claim 32, wherein said perfluoroalkenyl group is a 1,1-di(perfluoromethyl)-2-perfluoroethylethenyl group or a 1,1-di(perfluoroisopropyl)-2-perfluoromethylethenyl group.

34. The pattern formation method of claim 33, wherein said fluorine-based surface active agent having said 1,1-di(perfluoromethyl)-2-perfluoroethylethenyl group is 1,1-di(perfluoromethyl)-2-perfluoroethylethenyloxybenzyltrimethylammonium or 1,1-di(perfluoromethyl)-2-perfluoroethylethenylpolyoxyethylene ether.

35. The pattern formation method of claim 33, wherein said fluorine-based surface active agent having said 1,1-di(perfluoroisopropyl)-2-perfluoromethylethenyl group is 1,1-di(perfluoroisopropyl)-2-perfluoromethylethenyloxybenzyltrimethylammonium or 1,1-di(perfluoroisopropyl)-2-perfluoromethylethenylpolyoxyethylene ether.

36. The pattern formation method of claim 22, wherein said liquid is water or perfluoropolyether.

37. The pattern formation method of claim 22, wherein said liquid is an acidic solution.

38. The pattern formation method of claim 37, wherein said acidic solution is a phosphoric acid aqueous solution or a cesium sulfate aqueous solution.

39. The pattern formation method of claim 22, wherein said exposing light is KrF excimer laser, ArF excimer laser, $F_2$ laser, ArKr laser or $Ar_2$ laser.

40. The pattern formation method of claim 1, wherein the step of forming a barrier film is performed by spin-coating a barrier film material.

41. The pattern formation method of claim 22, wherein the step of forming a barrier film is performed by spin-coating a barrier film material.

42. The pattern formation method of claim 22, wherein the thickness of the barrier film is between 0.01 μm and 0.15 μm.

43. The pattern formation method of claim 23, wherein the annealing temperature of the barrier film is in the range of 100° C. to 150° C.

44. The pattern formation method of claim 22, wherein the liquid is provided on the barrier film by a puddle method.

* * * * *